United States Patent
Epple et al.

(10) Patent No.: US 7,209,292 B2
(45) Date of Patent: Apr. 24, 2007

(54) PROJECTION OBJECTIVE, ESPECIALLY FOR MICROLITHOGRAPHY, AND METHOD FOR ADJUSTING A PROJECTION OBJECTIVE

(75) Inventors: Alexander Epple, Aalen (DE); Paul Graeupner, Aalen (DE); Winfried Kaiser, Aalen (DE); Reiner Garreis, Aalen (DE); Wilhelm Ulrich, Aalen (DE)

(73) Assignee: Carl Zeiss SMT AG, Oberkochen (DE)

( * ) Notice: Subject to any disclaimer, the term of this patent is extended or adjusted under 35 U.S.C. 154(b) by 298 days.

(21) Appl. No.: 10/448,339

(22) Filed: May 30, 2003

(65) Prior Publication Data

US 2004/0109237 A1 Jun. 10, 2004

(30) Foreign Application Priority Data

Dec. 9, 2002 (DE) .............................. 102 58 718

(51) Int. Cl.
*G02B 3/00* (2006.01)
*G02B 15/02* (2006.01)
*G02B 27/02* (2006.01)

(52) U.S. Cl. ...................... 359/649; 359/650; 359/651; 359/656; 359/798; 359/804; 359/675; 359/379; 359/381; 359/392; 359/396

(58) Field of Classification Search ........ 359/649–651, 359/656–661, 798, 804, 675, 672, 379, 381, 359/392, 396
See application file for complete search history.

(56) References Cited

U.S. PATENT DOCUMENTS

| 4,208,101 A | 6/1980 | Trapp et al. |
| 4,346,164 A | 8/1982 | Tabarelli et al. |
| 4,480,910 A | 11/1984 | Takanashi et al. |
| 4,509,852 A | 4/1985 | Tabarelli et al. |
| 5,677,525 A | 10/1997 | Völcker et al. |
| 5,825,043 A * | 10/1998 | Suwa .......................... 250/548 |
| 5,973,863 A | 10/1999 | Hatasawa et al. |
| 2002/0163629 A1* | 11/2002 | Switkes et al. ................ 355/53 |

FOREIGN PATENT DOCUMENTS

| DE | 2655041 A1 | 6/1978 |
| DE | 102 10 899 A1 | 9/2003 |
| JP | 7-220990 A | 8/1995 |
| JP | 2002-250865 A | 9/2002 |
| WO | WO 03/077036 A1 | 9/2003 |

* cited by examiner

Primary Examiner—Evelyn A. Lester
(74) Attorney, Agent, or Firm—Sughrue Mion, PLLC

(57) ABSTRACT

A method of adjusting a projection objective permits the projection objective to be adjusted between an immersion configuration and a dry configuration. The projection objective includes optical elements arranged along an optical axis thereof, which include a first group of elements following the object plane and a last optical element following the first group, which is arranged near the image plane. The last optical element defines an exit surface of the projection objective, which is arranged at a working distance from the image plane. The last optical element is substantially without refracting power and has no or only slight curvature. The method includes varying the thickness of the last optical element, changing the refractive index of the space between the exit surface and the image plane by introducing or removing an immersion medium, and axially displacing the last optical element to set a working distance.

99 Claims, 5 Drawing Sheets

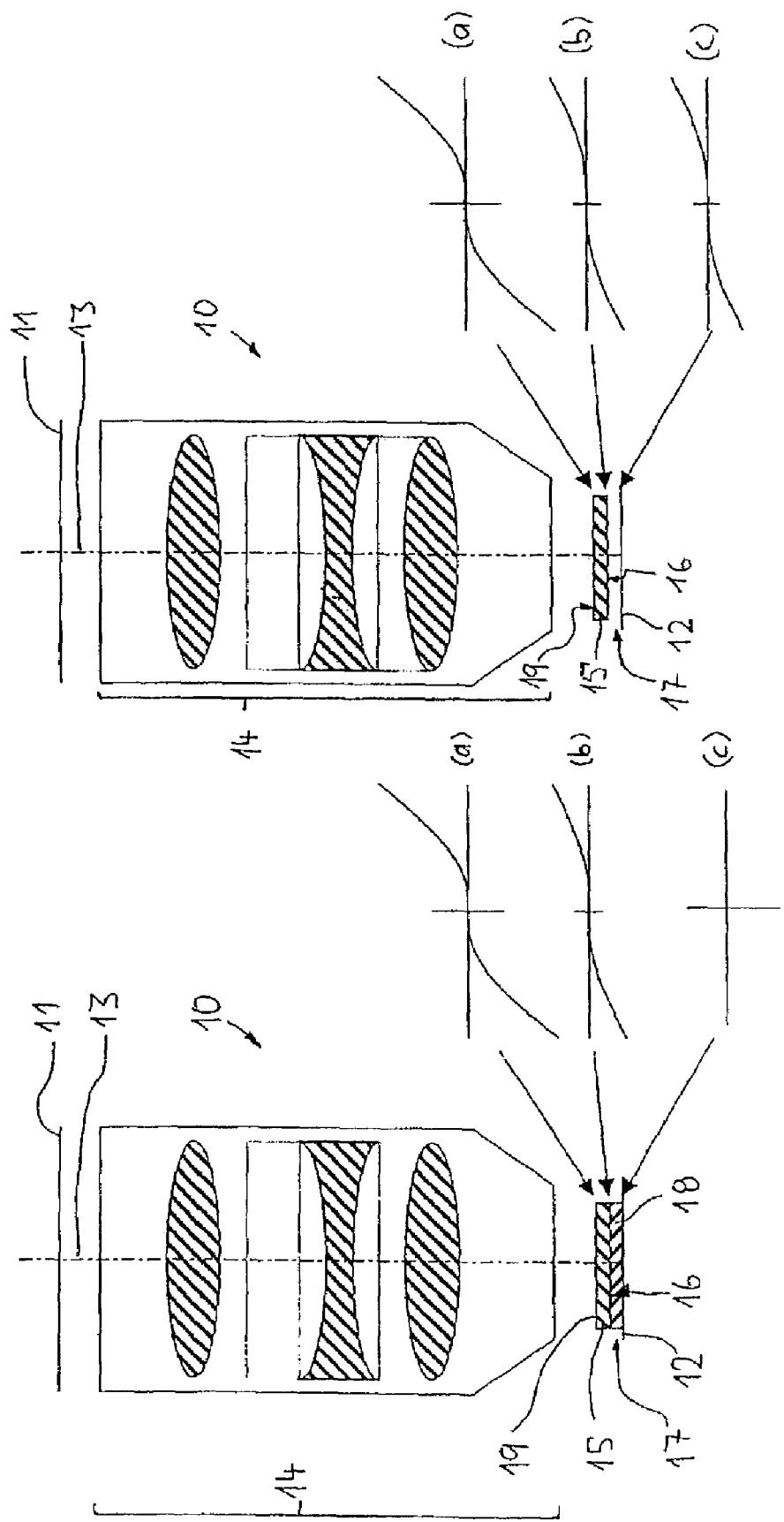

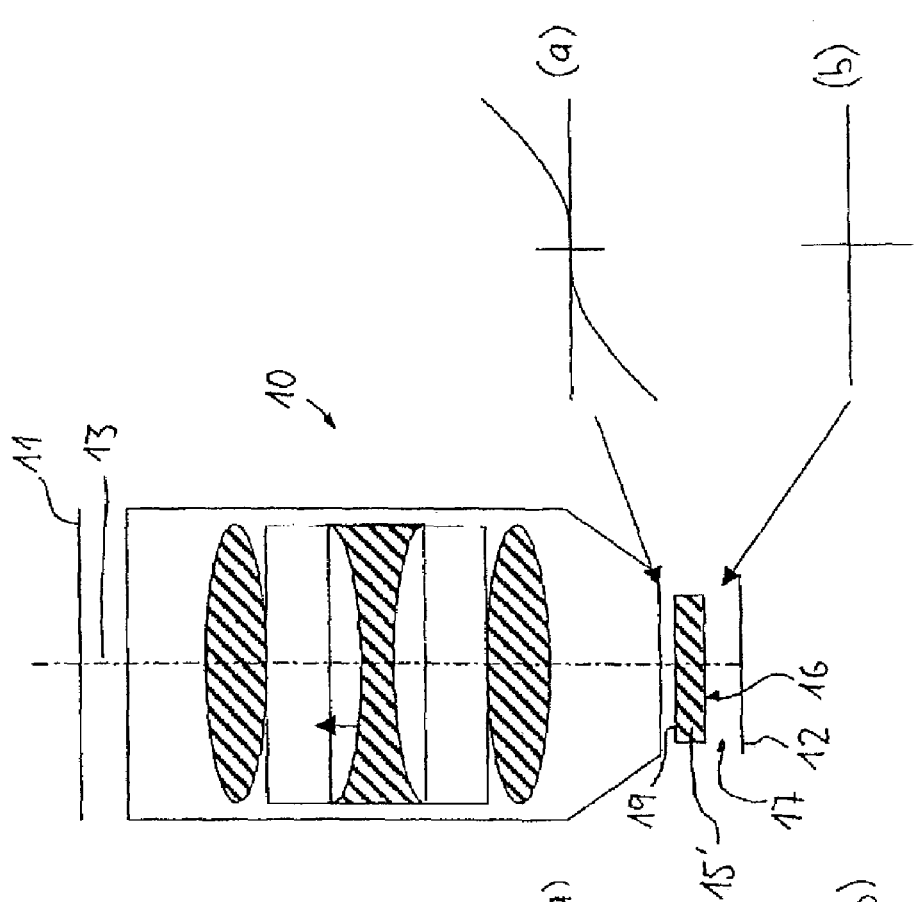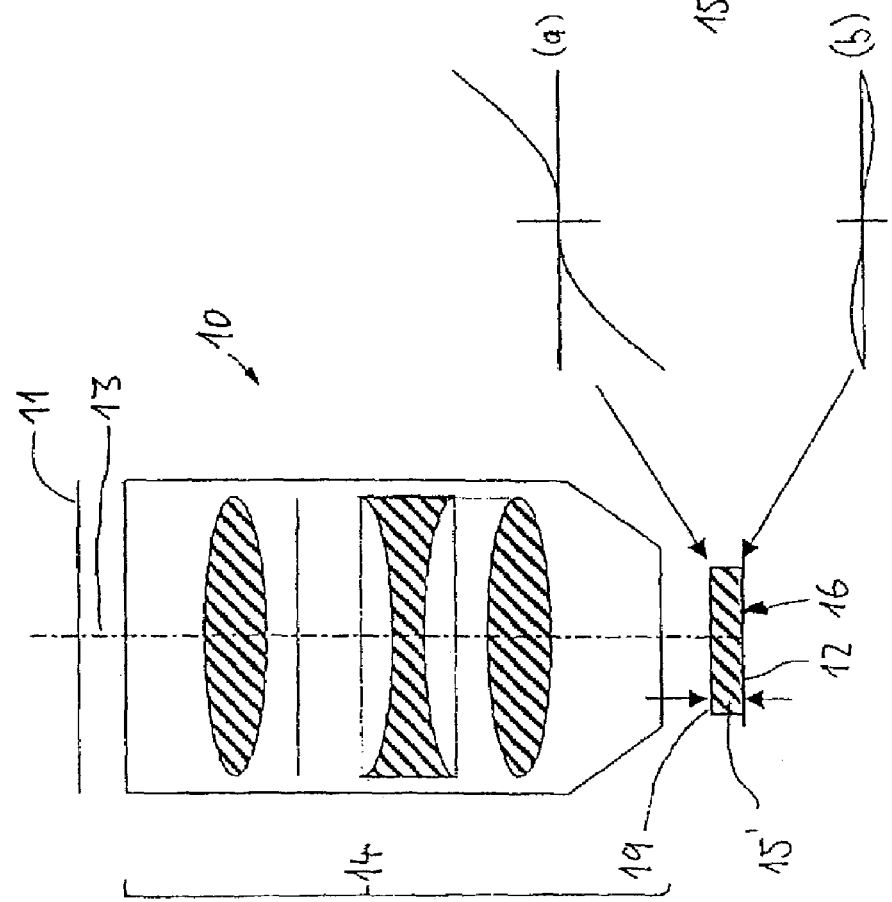

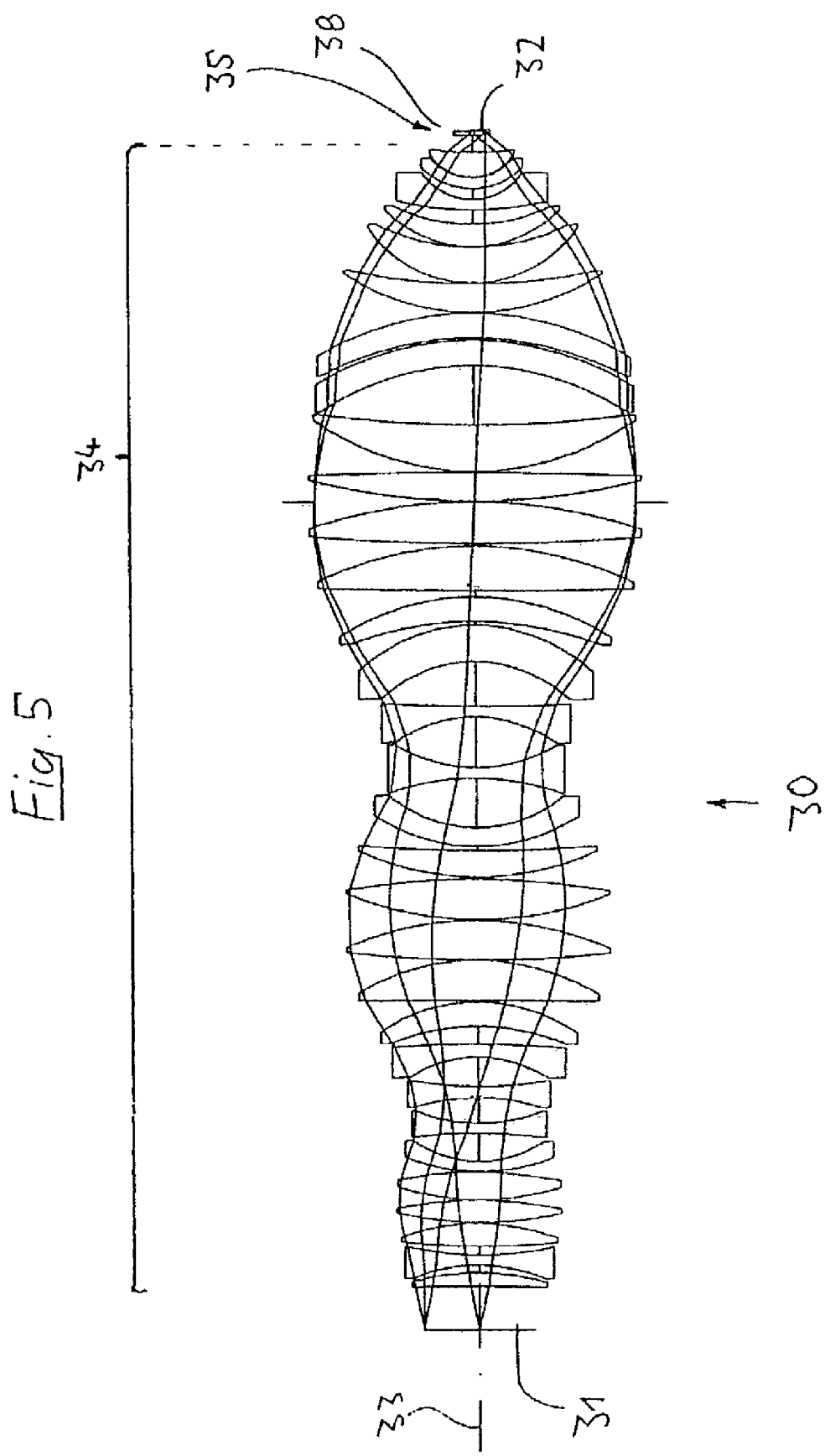

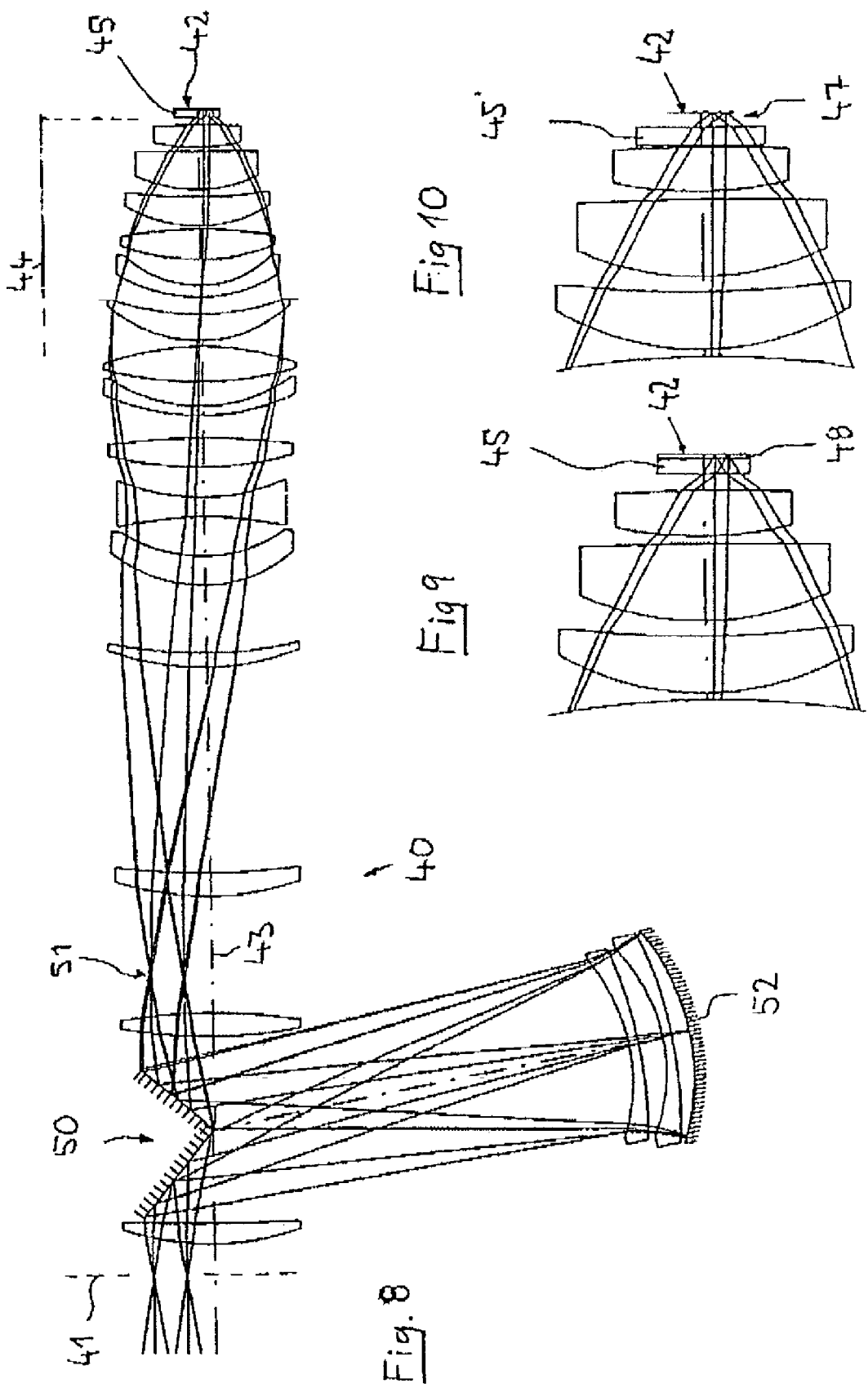

PROJECTION OBJECTIVE, ESPECIALLY FOR MICROLITHOGRAPHY, AND METHOD FOR ADJUSTING A PROJECTION OBJECTIVE

The following disclosure is based on German Patent Application No. 102 58 718.3 filed on Dec. 9, 2002, which is incorporated into this application by reference.

BACKGROUND OF THE INVENTION

1. Field of the Invention

The invention relates to a projection objective for projecting a pattern arranged in an object plane of the projection objective into an image plane of the projection objective, and to a method for adjusting such a projection objective. The preferred field of application is projection objectives for use in microlithography projection exposure systems.

2. Description of the Related Art

Photolithographic projection objectives have been used for many decades for producing semiconductor components and other finely structured components. They are used to project patterns of photomasks or graduated plates (graticules), which are also referred to below as masks or reticles, onto an object coated with a light-sensitive layer, for example onto a semiconductor wafer coated with photoresist, with the maximum resolution and on a reducing scale.

In order to produce finer and finer structures of the order of magnitude of 100 nm or below, a number of development directions are being followed. Firstly, attempts are being made to enlarge the numerical aperture (NA) on the image side of the projection objective beyond the values currently usual into the range of NA=0.8 or above. In addition, shorter and shorter wavelengths are being used, preferably ultraviolet light with wavelengths of less than 260 nm, for example 248 nm, 193 nm, 157 nm or less. Attempts are also sometimes made to achieve an improvement in the resolution and/or depth of focus by using phase-shifting masks and/or oblique illumination.

Conventionally, use is made virtually exclusively of projection objectives in which, in the image space between the exit surface of the last optical element and the image plane, there is a finite working distance which, during operation, is filled with air or another suitable gas. Such systems are designated "dry systems" or "dry objectives". The image space is generally filled with helium, nitrogen or another gas or a gas mixture with a refractive index $n \approx 1$.

There are already approaches to improving the achievable resolution by an immersion medium with a high refractive index being introduced into the interspace between the exit surface of the last optical element and the substrate. This technique is referred to as immersion lithography. An earlier example of this is shown in U.S. Pat. No. 4,346,164. The projection objectives adapted to this technique are referred to as "immersion systems" or "immersion objectives". Merely because of the introduction of the immersion, the numerical aperture NA=n·sin θ, and therefore the resolution $$CD = k_1 \cdot \frac{\lambda}{NA}$$

is not changed. Here, θ is the paraxial marginal ray angle, λ is the wavelength and CD is the magnitude of the resultant critical dimension. The empirical constant $k_1$ is process-dependent. With the aid of immersion media, it is possible to achieve numerical apertures of NA>1, in particular up to NA=1.3 or 1.4. Typical working distances in immersion lithography lie considerably below the values normal in air systems.

The advantages of immersion lithography which are conventionally sought after lie substantially in the potential of increasing the numerical aperture to values NA>1, and therefore in the improved resolution. Some refractive projection objectives which are suitable for immersion lithography and have numerical apertures NA>1 on the image side are disclosed in the patent applications DE 102 10 899 and PCT/EP 02/04846 from the applicant.

Another parameter which is important for the exposure process is the depth of focus (DOF) that can be achieved. In the case of air systems, this reduces in proportion to $1/NA^2$, so that with high-aperture projection objectives it again becomes difficult to obtain the values for the depth of focus which are suitable in practice. As a result, the requirements on the correctly positioned arrangement of the substrates to be exposed and their surface quality are increased considerably.

SUMMARY OF THE INVENTION

It is one object of the invention to provide a projection objective and a suitable method for adjusting projection objectives which permit the user to carry out exposure processes under different process conditions optimally.

As a solution to this and other objects, this invention, according to one formulation, provides a projection objective for projecting a pattern arranged in an object plane of the projection objective into an image plane of the projection objective, having a multiplicity of optical elements which are arranged along an optical axis of the projection objective, wherein: the optical elements comprise a first group of optical elements following the object plane, and a last optical element following the first group, arranged next to the image plane and defining an exit surface of the projection objective which is arranged at a working distance from the image plane; the last optical element is substantially without refracting power and has no curvature or only slight curvature; and the projection objective is adapted with reference to aberrations to the effect that the working distance is filled up with an immersion medium with a refractive index substantially greater than 1.

According to another formulation the invention provides a projection objective for projecting a pattern arranged in an object plane of the projection objective into an image plane of the projection objective, having a multiplicity of optical elements which are arranged along an optical axis of the projection objective, wherein: the optical elements comprise a first group of optical elements following the object plane, and a last optical element following the first group, arranged next to the image plane and defining an exit surface of the projection objective which is arranged at a working distance from the image plane; the last optical element is substantially without refracting power and has no curvature or only slight curvature; and the projection objective is adapted with reference to aberrations to the effect that the working distance is filled up with a gas with a refractive index close to 1.

According to yet another formulation this invention provides a method for adjusting a projection objective which is provided for projecting a pattern arranged in an object plane of the projection objective into an image plane of the projection objective, and has a multiplicity of optical elements, wherein the optical elements comprise a first group of optical elements following the object plane, and a last optical element following the first group, arranged next to the image plane and defining an exit surface of the projection objective which is arranged at a working distance from the image plane; the last optical element is substantially without refracting power and has no curvature or only slight curvature, the method comprising: varying the thickness of the last optical element; and changing the refractive index of the space between the exit surface and the image plane by introducing or removing an immersion medium.

According to another formulation the invention provides a method for adjusting a projection objective which is provided for projecting a pattern arranged in an object plane of the projection objective into an image plane of the projection objective and has a multiplicity of optical elements, wherein the optical elements comprise a first group of optical elements following the object plane, and a last optical element following the first group, arranged next to the image plane and defining an exit surface of the projection objective which is arranged at a working distance from the image plane; and the last optical element is substantially without refracting power and has no curvature or only slight curvature, the method comprising the following steps: removing the last optical element from the projection objective in order to produce a residual objective; replacing the last optical element by a plane-parallel plate which is large by comparison with the exit surface of the projection objective; applying a layer of an immersion medium to an object to be exposed; placing the plane-parallel plate on the layer of an immersion medium; and exposing the object to be exposed through this combination of plate and immersion medium with the aid of the residual objective.

According to yet another formulation the invention provides a method for adjusting a projection objective which is provided for projecting a pattern arranged in an object plane of the projection objective into an image plane of the projection objective and has a multiplicity of optical elements, wherein the optical elements comprise a first group of optical elements following the object plane, and a last optical element following the first group, arranged next to the image plane and defining an exit surface of the projection objective which is arranged at a working distance from the image plane; the method comprising the following steps: separating a plane-parallel plate from the last optical element in order to reduce the thickness; and enlarging the refractive index of the space between the exit surface and the image plane by introducing an immersion medium.

Advantageous embodiments are specified in the dependent claims. The wording of all the claims is made part of the content of the description by reference.

Optical elements with little refracting power in the sense of the application are either substantially without refracting power, such as a plane parallel plate, or have only a very low refracting power. They may be elements with at least a slightly curved surface, in which the radius of the curved optical surface is greater than the diameter of the optical element. The exit side is ideally largely flat, so that at most little curvature results. Given correct adjustment, a substantially uniform thickness of the immersion layer can be ensured. In optical elements with these properties, axial displacement parallel to the optical axis is possible without substantial changes in the optical properties of the system.

One special feature of such an immersion objective is that it can be adjusted between an "immersion configuration" and a "dry configuration" by means of slight interventions in the mechanical/optical configuration. A "dry configuration" is a mechanical/optical configuration of the projection objective in which the latter can be used as a "dry system". In the dry configuration, the optical properties of the projection objectives are optimized in such a way that, given a gas-filled operating distance on the image side of the exposed substrate, optimum projection conditions are present. As opposed to this, the "immersion configuration" is achieved by the fact that in the case of this mechanical/optical configuration of the same projection objective, optimum projection on the substrate is provided when there is an immersion medium between the exit surface of the projection objective and the substrate, the refractive index of said immersion medium being considerably higher than that of air or of another gas normally used.

The optical elements of the first optical group are designed overall in such a way that they effect spherical under correction of the wavefronts passing through. The thickness of the last optical element, the refractive index (or a refractive index combination) of the material of the last optical element and the refractive index of the immersion medium used are in this case matched to one another in such a way that a sufficiently good correction state of the projection is present in the image plane, in particular with respect to spherical aberration.

There is preferably a large distance between the first group and the last optical element, which permits substantial axial displacement of the last optical element, in particular without displacement of adjacent optical elements. The possibility of displacing the last optical element axially relative to the image plane during adjustment permits the working distance between exit surface and substrate surface to be set suitably. The projection objective is preferably designed in such a way that the working distance in the immersion configuration is smaller than in the dry configuration. Typical working distances for dry systems can lie in the region of several mm, for example between about 5 and about 20 mm, in particular between about 6 and about 12 mm. Typical working distances in the immersion configuration, on the other hand, can be considerably smaller, they can lie in the region of a few mm, for example 1 to 2 mm, or below.

With the aid of a method provided by the invention for adjusting a projection objective, this immersion objective can be changed into a dry objective with a few measures. The method comprises changing the thickness of the last optical element and changing the refractive index of the space between the exit surface and the image plane. In addition, an axial displacement of the last optical element is preferably provided in order to set a suitable working distance.

During the change from the immersion configuration to the dry configuration, for example the refractive index in the working region on the image side is reduced from relatively high values of the immersion medium (typically n>1.3) to smaller values around about n=1 to 1.1 for a suitable gas. The thickness of the last optical element is changed, generally increased, and the optical element, if required or expedient, is displaced in the direction of the first group, in order to set a greater working distance.

In the event of a reconfiguration of the system from a dry system to an immersion system, the changes proceed in the opposite direction. In this case, the thickness of the last optical element is normally reduced and, if appropriate, the optical element is displaced in the direction of the image plane in order to set a smaller working distance. As a result of the introduction of an immersion medium into the distance region (which has become smaller), the refractive index of this region is increased.

The physical background of the measures described can be understood as follows. A last optical element with the described properties, for example a substantially plane parallel plate, on its own has the effect of spherical overcorrection whose extent decreases the greater the refractive index of the material. The overcorrection which can be produced is scaled with the thickness and decreases with decreasing thickness. These effects are known per se. For example, U.S. Pat. No. 5,973,863 describes a dry objective which can have a replaceable plate as the last optical element. By exchanging plates with different curvatures, spherical aberration and/or image field curvature are adjusted.

The aperture error SPH of a plane plate with a thickness d in air can be calculated, for example, as follows as a longitudinal aberration SPH for the edge of the pupil:

$$SPH = d \cdot \left( \frac{1}{n} - \sqrt{\frac{1-NA^2}{n^2-NA^2}} \right)$$

If, for example, a plane plate is replaced by a medium with a different refractive index, then the spherical aberration which the said plate introduces into the system is also changed. Theoretically, however, by scaling the thickness of the new optical element, the spherical aberration can be adapted to the value before the exchange only for exactly one pupil height (that is to say in the above formula a value of NA<NA of the objective), so that zonal errors remain in the spherical aberration. These zonal errors are greater the thicker the region to be exchanged and the more highly the refractive index of the immersion medium differs from the refractive index of the last optical element.

Small working distances in the immersion configuration, small numerical apertures of the projection objectives and/or good agreement between the refractive indices of the material adjoining the exit surface and immersion medium favour the minimization of zonal errors. Depending on the specifications of the system, therefore, such a basic compensation may be adequate to adjust a dry objective to an immersion objective (or vice versa).

It is in particular also possible, when modifying the system from immersion to dry configuration, to replace the immersion medium by an optically transparent material with good refractive index agreement (index matching). For example, by using calcium fluoride, lithium fluoride or the like instead of quartz glass for the optical component adjoining the exit surface, improved index matching can be achieved. In this way, the production of residual aberration can be reduced substantially. The optical material of the last optical element adjoining the exit surface should have a refractive index $n_E$ which is close to the refractive index $n_I$ of the immersion medium, it being preferable for the ratio $n_I/n_E$ to be more than 0.8, in particular more than 0.9. For example, in the case of a last optical element comprising two plates, the last plate (with exit surface) can consist of calcium fluoride or lithium fluoride. This plate can be installed in the case of the dry configuration and removed in the case of the immersion configuration. Its optical effect is then largely replaced by the immersion fluid.

If it is necessary or desired to correct the remaining zonal errors, the projection objective can additionally be adjusted further, for example by the air spaces between the lenses being varied specifically. This will be explained in more detail further below.

It has been shown that, by using highly refractive immersion fluids, a significant increase in the depth of focus can be achieved. This effect is independent of the numerical aperture and can be used in particular at apertures of less than 1.0. It can be shown that the depth of focus can be calculated as follows:

$$DOF = k_2 \cdot \lambda / [2 \cdot n(1 - \sqrt{1-(NA/n)^2}\,)]$$

This relationship for small values of NA changes to the known paraxial relationship $$DOF = k_2 \cdot n \frac{\lambda}{NA}$$

The constant $k_2$ is process-dependent. The result of this is, for example, that with a projection objective with NA=0.95 and a refractive index n=1.45 of the immersion medium as compared with a dry objective (n=1.0), a gain in depth of focus of virtually a factor 2 can be achieved. In this way, the requirements on the accuracy of positioning of the substrates to be exposed and on their surface profile can be reduced considerably. In addition, even with non-ideal focusing and/or with already structured surfaces, extremely fine structures can be produced with adequate sharpness.

The immersion media used can be, for example, suitable liquids. Typical refractive indices of suitable immersion fluids can be around n≈1.3 or higher. In the article "Immersion Lithography at 157 nm" by M. Switkes and M. Rothschild, J. Vac. Sci. Technol. B 19 (6), November/December 2001, pp 1ff, immersion liquids based on perfluoropolyethers (PFPE) are presented, which are sufficiently transparent at 157 nm working wavelength and are compatible with some photoresist materials currently used in microlithography. One tested immersion liquid has a refractive index n=1.37 at 157 nm. At 193 nm wavelength, for example, deionized water with refractive index n=1.45 can be used.

The last optical element can be mounted such that it can be displaced axially. By means of suitable mounting of the last optical element, for example, z manipulation, that is to say parallel displacement of the entire optical element parallel to the optical axis, is possible. Suitable mounts for carrying out such axial movements are known, for example from U.S. Pat. No. 4,961,001. For the purpose of displacement, the element can also be removed and installed again after the insertion or removal of a spacer, in order to fit it at various axial positions.

It is possible for the last optical element to have a thickness which can be varied without removal of material or application of material. For example, the last optical element can comprise two or more components disconnectably or separably connected to one another, which are arranged at a distance from one another, clipped to one another or are interconnected in an optically neutral fashion. If, for example, the last optical element has a (thick) inner and a (thin) outer plate, the thickness of the last optical element can be reduced or increased substantially by the thickness of the thin plate by removing or inserting the thin plate, respectively, and therefore the thickness of the element can be changed by this amount. The last optical element can thus be constructed in one piece or in several pieces. It can in general also be designated the second group.

It is also possible to vary the thickness by material-removing or material-applying processing of the last optical element. For this purpose, the last optical element is normally removed and installed again after adjusting the thickness.

If the last optical element has one or more substantially plane parallel plates of transparent material, then this has the advantage that this element can be shifted or displaced freely along the optical axis in order to adjust the working distance, without the axial position having any influence on the aberrations of the objective.

In order to facilitate axial shifting or displacement of the last optical element, in some embodiments of projection objectives according to the invention, a free working distance, that is to say one free of material, in front of the last element (that is to say within the projection objective) is more than about 0.5%–1% of the overall length of the projection objective. This means that larger displacement travels are possible, which can typically be of the order of magnitude of several millmetres to some centimetres. It is beneficial if the last optical element has relatively large axial clearances on both sides. For example, a sum of the free distance in front of the last optical element and the distance between the exit surface and image plane is greater than approximately 0.5%–1% of the overall length of the projection objective.

If the operating distance of a dry objective is reduced and filled with an immersion medium, for example a liquid, then these design changes will generally lead to severe aberrations, which have their origin primarily in the finite thickness of the immersion layer and the normally relatively high numerical aperture on the image side. The same is true when the working distance is increased and the immersion medium is removed during the change from immersion to dry objective. In particular in the case of objectives that are telecentric on the image side, spherical aberration dominates here. In some projection objectives according to the invention, these aberrations can largely be compensated for by a specific thickness change in the last element, which has substantially no refracting power.

It is possible for residual errors that cannot be compensated for to remain, in particular in the field zone (zonal errors). In order to reduce these residual errors, in some embodiments it is possible to vary the optical properties of the first group specifically in such a way that these residual errors can largely be eliminated.

In some embodiments, it is possible, by means of suitable displacement of at least one displaceable optical element of the first group, to achieve substantial or complete compensation (adjustment). The critical aberration is spherical aberration. There are embodiments in which the (at least one) displaceable optical element can be displaced along the optical axis. A single displacement during adjustment may be sufficient. This can be achieved, for example, by installing or removing adjacent spacers. Adjustment during operation would also be possible. For this purpose, the optical element can be mounted in a suitable mounting with the possibility of controllable z manipulation and can therefore be movable. It has proven to be advantageous if a plurality of displaceable and/or movable optical elements are provided, for example up to 5, 6, 7, 8, 9, 10 or more such optical elements. As a result, the displacements and/or movements of the elements required to eliminate the overall aberrations can be distributed to many elements, so that only fine displacements are required on each individual one of these elements. This makes the mechanical construction easier and permits more degrees of freedom in manipulation.

Alternatively or additionally to axial displacements, tilting or decentring of one or more movable elements can also be provided.

The possibility provided in some projection objectives of adjusting between the immersion configuration and dry configuration can be seen in the design of some embodiments in the fact that a free distance in front of a displaceable element and/or moveable element and/or behind the displaceable element and/or movable element is dimensioned so large that it is possible by displacing the optical element to correct at least a sufficient fraction of aberrations which are produced by the introduction of an immersion medium in the operating distance region on the image side.

Alternatively or additionally, the projection objective can be assigned at least one exchangeable optical correction element which preferably has at least one aspherical surface. For example, this can be a set of two or more aspherized correction plates, whose optical effect is in each case designed such that residual aberrations when changing from a dry configuration to an immersion configuration (or vice versa) are corrected. Correction elements can be held in a changeable holder, for example a turret, and are normally introduced at a suitable point within the first group, for example in the vicinity of a pupil plane or a field plane of the projection objective.

Alternatively or additionally, it is also possible to configure an already existing optical surface, for example an entry or exit surface of a lens, as a corrective surface, for example by a spherical surface being machined to form an aspherical surface.

In some embodiments, on at least one optical element having at least one curved optical surface, the curvature of this optical surface can be varied permanently or reversibly. As a result, during the change between a dry configuration and an immersion configuration, in particular at least one lens radius can also be varied. For example, the variable curved optical surface can be formed by an adaptive mirror or a distortable lens. The change in at least one radius of an optical surface can be useful to correct the Petzval condition. This can be useful, for example, in the case of dry objectives in which the exit surface is not flat. Varying the radius is particularly effective in relation to adjusting the optical properties when it is the radius of one of the last (nearest the image) radii of the projection objective and does not adjoin the immersion medium.

Many embodiments of projection objectives according to the invention are optimized, with a beneficial construction, to give the end user the possibility of process management with a great depth of focus. Therefore, these projection objectives can be constructed in such a way that when an immersion medium is used between exit surface and image plane, there is a numerical aperture on the image side of NA<1, this preferably lying between about 0.7 and 1, in particular between 0.8 and 1. Numerical apertures on the image side in the vicinity of the value 1 have the advantage that, in this high-aperture range, the depth of focus increases disproportionally as the aperture increases.

The previous and other properties can be seen not only in the claims but also in the description and the drawings, wherein individual characteristics may be used either alone or in sub-combinations as an embodiment of the invention and in other areas and may individually represent advantageous and patentable embodiments.

BRIEF DESCRIPTION OF THE DRAWINGS

Exemplary embodiments of the invention are illustrated in the drawings and will be explained in more detail below.

FIG. 1 is a schematic illustration of a refractive projection objective in the immersion configuration with graphs relating to the state of correction (transverse aberrations of the axial point);

FIG. 2 is a schematic illustration of the projection objective after removal of the immersion medium with corresponding graphs relating to the state of correction;

FIG. 3 is a schematic illustration of the projection objective shown in FIG. 1 following an increase in the thickness of the last optical element, with corresponding illustrations of the state of correction;

FIG. 4 is a schematic illustration of the projection objective shown in FIG. 1 at the change to the dry configuration with an enlarged working distance and displacement of at least one lens remote from the wafer, and also corresponding graphs relating to the state of correction;

FIG. 5 shows a lens in section through an embodiment of a refractive projection objective in the immersion configuration;

FIG. 8 shows an embodiment of a catadioptric projection objective with the geometric beam splitter in an immersion configuration;

FIG. 9 shows an enlarged detail of the lenses close to the image of the projection objective shown in FIG. 8 and FIG. 10 shows the detail shown in FIG. 9 for a dry configuration of the projection objective shown in FIG. 8.

DETAILED DESCRIPTION OF THE PREFERRED EMBODIMENTS

Figure 7:
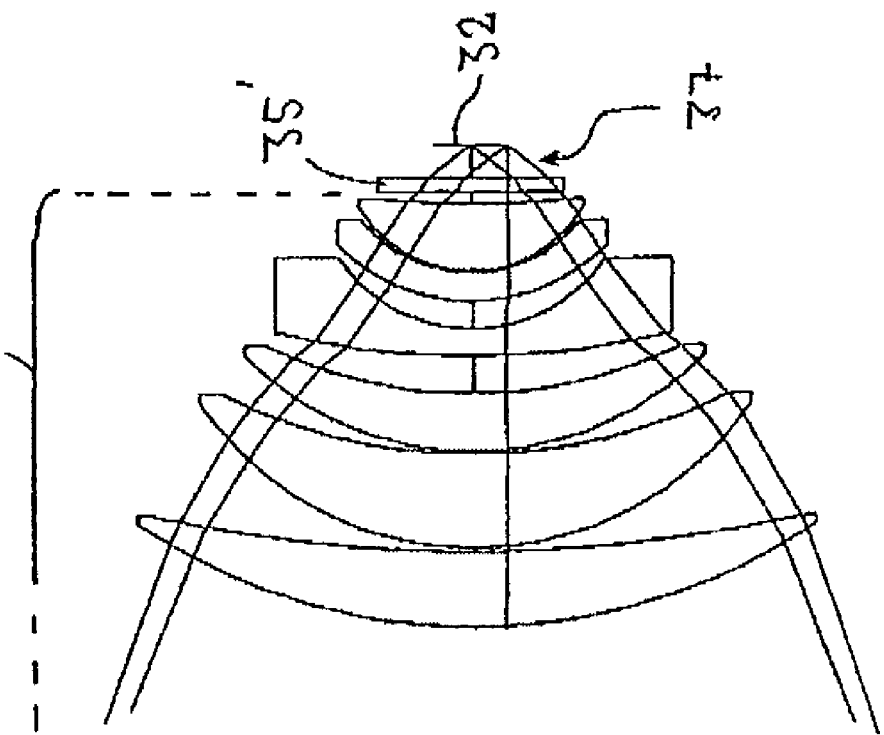
FIG. 7 shows an enlarged illustration according to FIG. 6 of the same projection objective after adjustment to the dry configuration.

FIG. 1 shows in schematic form a refractive projection objective 10 for the microlithographic production of semiconductor components and other finely structured components. The reduction objective, operating from the deep UV range (DUV), is used to project patterns of photomasks (reticles) which are arranged in the object plane 11 of the projection objective on a reduced scale onto a semiconductor wafer which is coated with photoresist and is to be arranged in the image plane 12 of the projection objective. The projection objective has a large number of optical elements in the form of lenses of synthetic quartz glass, which are arranged along the optical axis 13 of the system. The optical elements comprise a first group 14 immediately following the object plane, and a last optical element 15, which follows the first group 14 and lies closest to the image plane 12. The last optical element will also be referred to below as the terminating element 15; it can consist of one or more components. The exit surface 16 of the terminating element, facing the image plane, simultaneously forms the exit surface 16 of the projection objective. This is arranged at a working distance of some millimetres from the image plane. The terminating element 15 is a plane parallel plate of quartz glass and therefore has no refracting power and no curvature. Between the first group 14 and the terminating element 16 there is a relatively large distance of some millimeters, which permits axial shifting or displacement of the terminating element 16 in the direction of the first group 14. The projection objective 10 is shown in its immersion configuration and therefore designed as an immersion objective. This means that, with respect to the image errors (aberrations) produced, it is adjusted in such a way that the image space 17 between exit surface 16 and image plane 12 is filled with an immersion medium 18, whose refractive index is considerably greater than 1. In the example, use is made of an immersion liquid which has a refractive index $n_I=1.4$ at a working wavelength of 248 nm.

The first group 14 of optical elements is designed overall in such a way that a wavefront passing through it is spherically undercorrected behind the first group and in front of the entry surface 19 of the last element. This state of correction is illustrated by the graph (a) alongside, which, for an axial field point, represents the state of correction as transverse aberration. The severe deviation of the aberration curve from the zero line symbolizes spherical undercorrection with a large magnitude.

As is known, plane parallel plates intrinsically introduce spherical overcorrection, which increases with the thickness of the plate and decreases as the refractive index of the material increases (see the formula relating to the calculation of SPH). Accordingly, after passing through the plane parallel plate 15, the wavefront is less severely undercorrected than before it enters the plate. This is illustrated schematically in graph (b).

The thin immersion layer 18, whose refractive index differs from the refractive index of the plate 15, likewise acts like a plane parallel plate and introduces further spherical overcorrection.

In the example, the thickness of the terminating plate 16 and its refractive index, and the thickness of the immersion layer 18 and its refractive index, and the spherical undercorrection of the first group 14 are matched to one another in such a way that the wavefront in the image plane 12 is substantially completely corrected with respect to spherical aberration (graph (c)). Therefore, in this immersion configuration, a sufficiently well corrected projection is possible.

By using FIGS. 2 to 4, a method of adjusting the projection objective will now be explained which makes it possible to use the same projection objective with few structural changes as a dry objective with a good state of correction. The method steps shown in FIGS. 2 to 4 can be carried out in the order shown or in a different order or at least partly simultaneously. In the method variant shown, in a first step the immersion medium 18 is removed from the image space (FIG. 2). This isolated measure changes nothing in the state of correction before entry into the terminating element 16 (graph (a)) and at the exit from the terminating element (graph (b)). However, as a result of removal of the highly refractive, plane parallel layer of immersion fluid from the image space, its overcorrective action is removed, so that the state of correction in the image plane 12 corresponds to the undercorrected state of correction at the exit surface 16 (compare graphs (b) and (c)).

In a further step (FIG. 3), the thickness of the last optical element 16 is then increased. In the process, its overcorrective action will increase with increasing thickness. The thickness is selected in accordance with the refractive index of the plate material to such an extent that the overcorrection effected by the thicker plate 16' largely compensates for the undercorrected state of correction at the plate entry 19 (graph (a)). The projection state in the image plane that can be achieved with this measure in the case of this projection objective is shown in graph (b) which, in the direction of the ordinate, has an enlarged scale in order to be able to illustrate the residual error pictorially. It can be seen that, in the example, a very good state of correction is achieved at the centre and at the edge of the pupil, while there is a slight overcorrection predominantly in the pupil zone.

In the method variant illustrated here, the projection objective is then changed into its dry configuration, shown in FIG. 4, in two further steps. One step, by means of actual displacement of the last optical element 15' in the direction of the first group 14, consists in setting a larger working distance as compared with the immersion configuration (FIG. 1). This can be done by means of axial displacement of the element 15' with the aid of a z manipulator that can be driven electrically or in another way. It is also possible to mount the last optical element individually and, with the aid of spacers between the mounts of the first group and the mount of the last optical element, to set a suitable distance by removing or installing spacers. Since the plane parallel plate 16 is as largely as possible free of refracting power and has no curvature, this axial displacement can be carried out without this having a measurable influence on the aberrations of the objective.

Without further measures, therefore, the state of correction of the dry configuration according to FIG. 4 would correspond to that of FIG. 3(b). However, in the embodiment shown, in the first group at least one of the lenses, namely the negative lens 20 shown, is mounted such that it can be displaced axially with the aid of a z manipulator. The residual error shown in FIG. 3(b) can in this case be compensated for by means a slight shifting of the lens 20 in the direction of the object plane (arrow), so that the finally adjusted dry objective has a sufficiently good state of correction at the light exit (graph (b)).

This last step, namely the fine adjustment with the aid of at least one manipulable or variable optical element in the first group, may be required frequently in order to be able to comply with close specifications. In the case of lower requirements, the first-named steps (changing the refractive index in the image space by introducing or removing an immersion fluid, varying the thickness of the last element and displacing the last element in order to change the working distance) may be sufficient to achieve reconfiguration between the immersion configuration and dry configuration (or vice versa).

These method steps are to some extent illustrated separately for illustrative reasons. In practice, the changes in the thickness of the terminating element and its axial displacement will frequently be implemented by a separately mounted terminating element of given thickness and axial position being removed and exchanged for a correspondingly mounted one with a different axial position and thickness.

In the following text, by using practical embodiments of refractive and catadioptric projection objectives, the feasibility of the invention will also be demonstrated in the case of high-power projection objectives for microlithography. FIG. 5 shows, by way of example, a purely refractive, rotationally symmetrical projection objective 30 for high-resolution microlithography, particularly in the DUV wavelength range. The design substantially corresponds to that objective which is shown in DE 198 55 108 (corresponding to U.S. Pat. No. 6,349,005 B1) and is illustrated extensively there. The disclosure of these documents in this regard is made the content of this description by reference.

The three-bellied system is designed for 248 nm working wavelength, with a value NA=0.8 has a field size of 26 mm·8 mm and exclusively has lenses of synthetic quartz glass. The specification of the design is summarized in tabular form in Table 1. In this case, column 1 indicates the number of the surfaces which refract or are distinguished in another way, column 2 the radius of the surfaces (in mm), column 3 the distance, designated as the thickness, of the surface from the following surface (in mm), column 4 the material, column 5 the refractive index of the material at the operating wavelength and column 6 the maximum usable radius (half the free diameter). The overall length L between object plane and image plane is about 1166 mm. All the curvatures are spherical.

Figure 6:
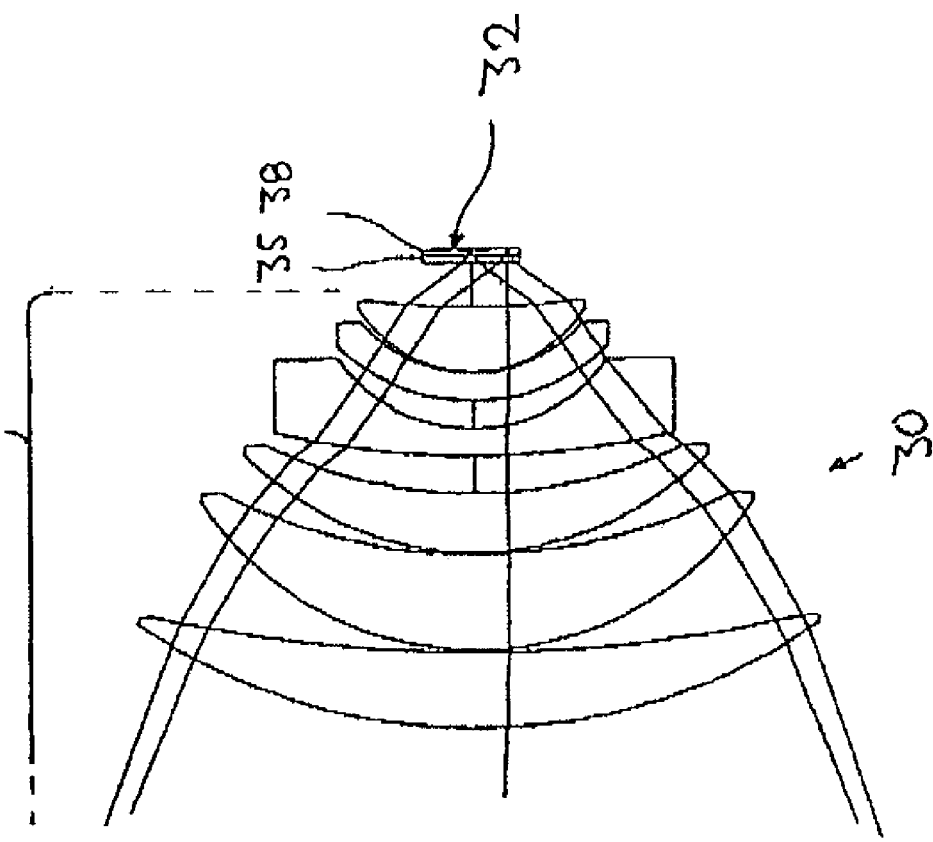
FIG. 6 shows an enlarged detail of the lenses close to the image of the projection objective from FIG. 5.

FIG. 5 and the enlarged illustration of the end region on the wafer side in FIG. 6 show the system in its immersion configuration (Table 1). It can be seen that, between the first group 34 of optical elements and the last element 35, there is a relatively large distance of about 16.25 mm. The last optical element 35 used is a plane parallel plate (surfaces 65, 66) with a thickness of 3 mm, which immediately adjoins an immersion layer 38 around 2 mm thick of deionized water, which fills up the space between the exit surface of the element 35 and the projection objective and the image plane 32. The state of correction of the system in this immersion configuration can be specified, for example, by a wavefront aberrration of about 13 m$\lambda$ rms.

If the system is changed, by means of the method steps explained above, into a dry configuration, then the end region on the wafer side assumes the configuration illustrated in the detail in FIG. 7. The specification in detail is specified in Table 2. It can be seen that the terminating plate 35 has been moved considerably closer to the last element of the first group 34, as a result of which the working distance 37 has increased from about 2 mm to about 12 mm. The thickness of the plate has increased from 3 mm to about 5 mm. In the example, this has been achieved by exchanging the thin plate 35 of FIG. 6 for a correspondingly thicker plate 35' (FIG. 7). For this purpose, the plates are mounted individually and dimensioned in each case such that, by exchanging the individual mounts, at the same time the correct axial distance between the first group 34 and the terminating element is also set. In other embodiments, axial displacement of the end plate with the aid of a z manipulator is provided. The increasing thickness between immersion and dry configuration is achieved by the thinner plate present in the immersion configuration having had a thin plate of about 2 mm thickness clipped to it. By means of this optically neutral connection, a last optical element comprising two components is produced, it being possible for the two components to be separated from each other in order to permit the change in thickness of the terminating element without removal.

Using FIGS. 8 to 10, it becomes clear that the invention is not restricted to refractive systems but can also be used in catadioptric projection objectives. The catadioptric projection objective 40 with geometric beam splitter 50 is provided for the purpose of projecting a pattern lying in its object plane 41 into the image plane 42 on a scale of 4:1 by producing a real intermediate image 51. The optical axis 43 is folded at the geometric beam splitter 50, in order to be able to use in the projection a concave mirror 52, which facilitates the chromatic correction of the overall system. The basic structure of the projection objective and its optical properties can be taken in detail from DE 101 27 227 (corresponding to EP 1 260 845), whose disclosure content is made the content of this description by reference.

FIGS. 8 and 9 and Table 3 reproduce the properties of the immersion configuration, while FIG. 10 and Table 4 disclose the corresponding dry configuration. The surfaces identified by "AS" in column 2 of the tables are aspherical, the surface shape can be calculated by using the aspherical data from the tables and the formula cited in EP 1 260 845. The projection objective 40 is designed for an operating wavelength of about 157 nm, in which the lens material calcium fluoride used for all the lenses has a refractive index of N=1.55841. The numerical aperture on the image side is NA=0.8, the system is designed for a field size of 22.7 mm² and is doubly telecentric.

In the immersion configuration (FIGS. 8 and 9), the largely plane parallel terminating element 45 (surfaces 46, 47) in contact with the immersion layer 48 is at a working distance of 2 mm from the image plane 42 and has a thickness of about 8 mm. The state of correction of this immersion configuration can, for example, be specified by means of a wavefront aberration of about 8 mλ rms.

In the dry configuration shown in FIG. 10 and Table 4, there is an enlarged working distance of about 7.8 mm, since the terminating plate is moved closer to the first group 44. The thickness of the terminating plate 45' has increased to about 9.7 mm between the immersion configuration and the dry configuration. The state of correction can, for example, be specified by a wavefront aberration of about 8 mλ rms.

In the following text, various corrective measures will be explained which make it possible to reduce any residual error which may have to be eliminated in accordance with the basic adjustments described above. One of the possibilities is to provide one of the spherical lens surfaces of the first group with an additional nanoasphere. Here, nanoasphere designates a spherical surface shape which differs only slightly (in the nanometer range) from a sphere and, as a result, can be produced relatively easily from a spherical lens. The catadioptric dry system with additional nanoasphere is illustrated in Table 5. Here, it can be seen that the originally spherical surface 32 is now formed as an aspherical surface. This can be achieved by exchanging correspondingly different lenses or by removal, surface machining, coating and subsequent installation. The state of correction of the system has improved considerably as a result. It can, for example, be specified by a wavefront aberration of about 8 mλ rms.

Elimination of residual errors is also possible by the light conductance of the overall system (product of numerical aperture and field size) being reduced. In this way, the requirements on the design are relieved overall. For example, the system shown in FIGS. 8 to 10 is shown in Table 6, and has a smaller field size of 20 mm·5 mm. In this way, a sufficiently good state of correction can be achieved, which, for example, can be specified by a wavefront aberration of about 9 mλ rms.

Within the context of the invention, it is also possible for the last optical element, for example a terminating plate, to be removed from the projection objective and, instead of this, for a plane parallel plate that is large as compared with the exit surface of the projection objective and has a suitable, in particular a different thickness, to be used, the said plate extending over the entire wafer or a major part of its surface. This plane parallel plate, together with the immersion liquid, is then placed on the wafer and exposed through this plate immersion combination. The "residual projection objective" in this case has a high level of spherical undercorrection. It can still be adjusted, if necessary, as described above.

By using the invention, it is also possible to adjust projection objectives in which the last optical element is initially not substantially free of reflecting power and substantially has no curvature, but, for example, is formed by a planoconvex lens with spherical or aspherical entry side and a largely or completely flat exit side. In this case, in order to produce an immersion configuration from this element, a plane plate can be split thereby to reduce its thickness. Other adjustment measures can be carried out in a manner analogous to the explanations above.

The invention provides combination projection objectives which can be used both as a dry objective and as an immersion objective. By means of suitable selection of design parameters, it becomes possible to adjust "dry objectives" constructed according to the invention with little effort to form an "immersion objective" or vice versa. In the case of dry objectives according to the invention, only relatively simple changes in the construction are required in order to permit use as an immersion system and in order therefore to permit the user an exposure process with a greater depth of focus. In addition, gains may be established in terms of resolution. Following adjustment of an immersion configuration to form a dry configuration, the advantages of the "dry" lithography can be used.

The invention can be used in purely refractive systems in exactly the same way as in catadioptric systems with and without beam splitters, it being possible in the case of beam splitter systems for both systems with physical beam splitters (for example beam splitter designs) and systems with geometric beam splitters to be considered. Further examples of suitable refractive systems are shown, for example, in the publications EP 1 245 984, EP 1 235 091 or U.S. Pat. No. 6,008,884. A suitable system catadioptric system with geometric beam splitter is shown in the U.S. patent application US 2002/0145811. In the case of the two last-named documents, systems with last elements in the form of planoconvex lenses are shown, which can be adjusted in the manner described with splitting of a plane plate and accompanying measures. The disclosures of these documents are made the content of this description by reference and can be combined with the present invention.

The above description of the preferred embodiments has been given by way of example. From the disclosure given, those skilled in the art will not only understand the present invention and its attendant advantages, but will also find apparent various changes and modifications to the structures and methods disclosed. It is sought, therefore, to cover all changes and modifications as fall within the spirit and scope of the invention, as defined by the appended claims, and equivalents thereof.

TABLE 1 i29o

| Surface | Radii | Thicknesses | Lenses | Refractive index 248.38 nm | 1/2 Free diameter |
| --- | --- | --- | --- | --- | --- |
| 0 | 0.000000000 | 32.000000000 |  | 1.00000000 | 54.410 |
| 1 | 0.000000000 | 10.587540450 | L710 | 0.99998200 | 61.093 |
| 2 | −2417.351767120 | 13.126300000 | SUPRA1 | 1.50833811 | 63.132 |
| 3 | −248.195466920 | 7.359264018 | L710 | 0.99998200 | 63.945 |

TABLE 1-continued j29o

| Surface | Radii | Thicknesses | Lenses | Refractive index 248.38 nm | 1/2 Free diameter |
|---|---|---|---|---|---|
| 4 | −168.131361870 | 10.000000000 | SUPRA1 | 1.50833811 | 64.202 |
| 5 | 328.986124739 | 7.907519166 | L710 | 0.99998200 | 70.046 |
| 6 | 671.742152743 | 22.614900000 | SUPRA1 | 1.50833811 | 71.945 |
| 7 | −219.346865952 | 1.054978296 | L710 | 0.99998200 | 73.402 |
| 8 | 351.854459479 | 21.378800000 | SUPRA1 | 1.50833811 | 77.449 |
| 9 | −417.329819985 | 0.748356148 | L710 | 0.99998200 | 77.668 |
| 10 | 266.259242017 | 26.426700000 | SUPRA1 | 1.50833811 | 76.971 |
| 11 | −418.068287643 | 0.747164758 | L710 | 0.99998200 | 75.964 |
| 12 | 195.049526899 | 10.000000000 | SUPRA1 | 1.50833811 | 69.816 |
| 13 | 112.784218098 | 27.264697553 | L710 | 0.99998200 | 64.221 |
| 14 | −548.976305020 | 10.000000000 | SUPRA1 | 1.50833811 | 63.660 |
| 15 | 167.581609987 | 25.042515270 | L710 | 0.99998200 | 61.992 |
| 16 | −203.629259785 | 10.000000000 | SUPRA1 | 1.50833811 | 62.349 |
| 17 | 360.120642869 | 28.995838980 | L710 | 0.99998200 | 66.965 |
| 18 | −127.653905514 | 12.696400000 | SUPRA1 | 1.50833811 | 68.153 |
| 19 | −1103.725724970 | 17.018787360 | L710 | 0.99998200 | 81.984 |
| 20 | −225.898831342 | 23.521200000 | SUPRA1 | 1.50833811 | 84.684 |
| 21 | −171.063497139 | 1.574450554 | L710 | 0.99998200 | 92.606 |
| 22 | −22770.163604600 | 38.438000000 | SUPRA1 | 1.50833811 | 109.997 |
| 23 | −229.816390281 | 0.749282985 | L710 | 0.99998200 | 113.270 |
| 24 | 1170.594630540 | 38.363100000 | SUPRA1 | 1.50833811 | 123.579 |
| 25 | −320.184892150 | 0.749629640 | L710 | 0.99998200 | 124.514 |
| 26 | 335.012872058 | 39.596800000 | SUPRA1 | 1.50833811 | 124.658 |
| 27 | −764.462984962 | 2.214257730 | L710 | 0.99998200 | 123.947 |
| 28 | 270.136227728 | 25.935800000 | SUPRA1 | 1.50833811 | 112.963 |
| 29 | 1248.618077510 | 4.352014987 | L710 | 0.99998200 | 110.825 |
| 30 | 177.098661261 | 18.578800000 | SUPRA1 | 1.50833811 | 96.632 |
| 31 | 131.459110961 | 48.405871098 | L710 | 0.99998200 | 84.997 |
| 32 | −254.431714105 | 10.000000000 | SUPRA1 | 1.50833811 | 83.694 |
| 33 | 149.734192113 | 49.515509852 | L710 | 0.99998200 | 77.858 |
| 34 | −137.204786283 | 10.000000000 | SUPRA1 | 1.50833811 | 78.232 |
| 35 | 1410.223675540 | 43.391488727 | L710 | 0.99998200 | 89.345 |
| 36 | −134.825941720 | 35.292100000 | SUPRA1 | 1.50833811 | 91.736 |
| 37 | −168.418502871 | 3.480235112 | L710 | 0.99998200 | 110.924 |
| 38 | −350.805989269 | 24.010800000 | SUPRA1 | 1.50832811 | 123.372 |
| 39 | −244.301424027 | 6.015284795 | L710 | 0.99998200 | 128.258 |
| 40 | 4941.534628580 | 43.549100000 | SUPRA1 | 1.50833811 | 147.192 |
| 41 | −357.889527255 | 2.367042190 | L710 | 0.99998200 | 149.417 |
| 42 | 1857.663670230 | 40.932000000 | SUPRA1 | 1.50833811 | 156.043 |
| 43 | −507.091567715 | −0.213252954 | L710 | 0.99998200 | 156.763 |
| 44 | 0.000000000 | 0.962846248 | L710 | 0.99998200 | 155.516 |
| 45 | 637.188120359 | 28.431900000 | SUPRA1 | 1.50833811 | 156.869 |
| 46 | −4285.746531360 | 0.749578310 | L710 | 0.99998200 | 156.617 |
| 47 | 265.928249908 | 45.432900000 | SUPRA1 | 1.50833811 | 152.353 |
| 48 | 1127.170329670 | 57.049328626 | L710 | 0.99998200 | 150.272 |
| 49 | −273.057181282 | 24.571800000 | SUPRA1 | 1.50833811 | 149.389 |
| 50 | −296.450446798 | 2.401860529 | L710 | 0.99998200 | 150.065 |
| 51 | −317.559071036 | 23.847600000 | SUPRA1 | 1.50833811 | 148.110 |
| 52 | −297.103672940 | 0.819938446 | L710 | 0.99998200 | 148.158 |
| 53 | 223.869192775 | 28.117900000 | SUPRA1 | 1.50833811 | 122.315 |
| 54 | 548.591751129 | 0.749776549 | L710 | 0.99998200 | 120.110 |
| 55 | 123.937471688 | 34.861300000 | SUPRA1 | 1.50833811 | 99.291 |
| 56 | 211.883788830 | 0.738299719 | L710 | 0.99998200 | 93.879 |
| 57 | 121.391085072 | 21.109500000 | SUPRA1 | 1.50833811 | 82.929 |
| 58 | 178.110541498 | 13.722409422 | L710 | 0.99998200 | 77.266 |
| 59 | 314.102464129 | 10.000000000 | SUPRA1 | 1.50833811 | 71.524 |
| 60 | 60.563892001 | 10.471596266 | L710 | 0.99998200 | 49.697 |
| 61 | 71.706607533 | 10.069000000 | SUPRA1 | 1.50833811 | 48.032 |
| 62 | 57.184242317 | 0.713865261 | L710 | 0.99998200 | 40.889 |
| 63 | 48.728728866 | 24.194000000 | SUPRA1 | 1.50833811 | 39.865 |
| 64 | 325.049018458 | 16.249640231 | L710 | 0.99998200 | 35.979 |
| 65 | 0.000000000 | 3.000000000 | SUPRA1 | 1.50833811 | 16.879 |
| 66 | 0.000000000 | 2.000000000 | IMMERS | 1.40000000 | 14.998 |
| 67 | 0.000000000 | 0.000000000 |  | 1.00000000 | 13.603 |

TABLE 2 j30o

| Surface | Radii | Thicknesses | Lenses | Refractive index 248.38 nm | 1/2 Free diameter |
|---|---|---|---|---|---|
| 0 | 0.000000000 | 32.000000000 |  | 1.00000000 | 54.410 |
| 1 | 0.000000000 | 10.283889256 | L710 | 0.99998200 | 61.093 |
| 2 | −2417.351767120 | 13.126300000 | SUPRA1 | 1.50833811 | 63.069 |
| 3 | −248.195466920 | 7.293007084 | L710 | 0.99998200 | 63.884 |
| 4 | −168.131361870 | 10.000000000 | SUPRA1 | 1.50833811 | 64.137 |
| 5 | 328.986124739 | 8.273191790 | L710 | 0.99998200 | 69.971 |
| 6 | 671.742152743 | 22.614900000 | SUPRA1 | 1.50833811 | 72.045 |
| 7 | −219.346865952 | 0.447882685 | L710 | 0.99998200 | 73.489 |
| 8 | 351.854459479 | 21.378800000 | SUPRA1 | 1.50833811 | 77.419 |
| 9 | −417.329819985 | 0.643718463 | L710 | 0.99998200 | 77.636 |
| 10 | 266.259242017 | 26.426700000 | SUPRA1 | 1.50833811 | 76.935 |
| 11 | −418.068287643 | 1.297611013 | L710 | 0.99998200 | 75.923 |
| 12 | 195.049526899 | 10.000000000 | SUPRA1 | 1.50833811 | 69.627 |
| 13 | 112.784218098 | 26.146948060 | L710 | 0.99998200 | 64.049 |
| 14 | −548.976305020 | 10.000000000 | SUPRA1 | 1.50833811 | 63.646 |
| 15 | 167.581609987 | 26.480913850 | L710 | 0.99998200 | 61.963 |
| 16 | −203.629259785 | 10.000000000 | SUPRA1 | 1.50833811 | 62.465 |
| 17 | 360.120642869 | 28.474843347 | L710 | 0.99998200 | 67.077 |
| 18 | −127.653905514 | 12.696400000 | SUPRA1 | 1.50833811 | 68.070 |
| 19 | −1103.725724970 | 17.347391549 | L710 | 0.99998200 | 81.856 |
| 20 | −225.898831342 | 23.521200000 | SUPRA1 | 1.50833811 | 84.765 |
| 21 | −171.063497139 | 1.525859924 | L710 | 0.99998200 | 92.671 |
| 22 | −22770.163604600 | 38.438000000 | SUPRA1 | 1.50833811 | 110.016 |
| 23 | −229.816390281 | 0.449372011 | L710 | 0.99998200 | 113.280 |
| 24 | 1170.594630540 | 38.363100000 | SUPRA1 | 1.50833811 | 123.463 |
| 25 | −320.184892150 | 0.449220757 | L710 | 0.99998200 | 124.404 |
| 26 | 335.012872058 | 39.596800000 | SUPRA1 | 1.50833811 | 124.508 |
| 27 | −764.462984962 | 0.448529485 | L710 | 0.99998200 | 123.785 |
| 28 | 270.136227728 | 25.935800000 | SUPRA1 | 1.50833811 | 113.275 |
| 29 | 1248.618077510 | 4.599063715 | L710 | 0.99998200 | 111.173 |
| 30 | 177.098661261 | 18.578800000 | SUPRA1 | 1.50833811 | 96.787 |
| 31 | 131.459110961 | 48.903368693 | L710 | 0.99998200 | 85.123 |
| 32 | −254.431714105 | 10.000000000 | SUPRA1 | 1.50833811 | 83.644 |
| 33 | 149.734192113 | 49.544589669 | L710 | 0.99998200 | 77.792 |
| 34 | −137.204786283 | 10.000000000 | SUPRA1 | 1.50833811 | 78.174 |
| 35 | 1410.223675540 | 43.113042129 | L710 | 0.99998200 | 89.233 |
| 36 | −134.825941720 | 35.292100000 | SUPRA1 | 1.50833811 | 91.558 |
| 37 | −168.418502871 | 4.049119334 | L710 | 0.99998200 | 110.696 |
| 38 | −350.805989269 | 24.010800000 | SUPRA1 | 1.50833811 | 123.308 |
| 39 | −244.301424027 | 5.341877309 | L710 | 0.99998200 | 128.188 |
| 40 | 4941.534628580 | 43.549100000 | SUPRA1 | 1.50833811 | 146.729 |
| 41 | −357.889527255 | 4.028668923 | L710 | 0.99998200 | 148.997 |
| 42 | 1857.663670230 | 40.932000000 | SUPRA1 | 1.50833811 | 155.818 |
| 43 | −507.091567715 | −1.371361371 | L710 | 0.99998200 | 156.540 |
| 44 | 0.000000000 | 2.120040201 | L710 | 0.99998200 | 155.343 |
| 45 | 637.188120359 | 28.431900000 | SUPRA1 | 1.50833811 | 156.764 |
| 46 | −4285.746531360 | 0.447699567 | L710 | 0.99998200 | 156.510 |
| 47 | 265.928249908 | 45.432900000 | SUPRA1 | 1.50833811 | 152.266 |
| 48 | 1127.170329670 | 56.966580248 | L710 | 0.99998200 | 150.172 |
| 49 | −273.057181282 | 24.571800000 | SUPRA1 | 1.50833811 | 149.291 |
| 50 | −296.450446798 | 2.661459751 | L710 | 0.99998200 | 149.961 |
| 51 | −317.559071036 | 23.847600000 | SUPRA1 | 1.50833811 | 147.915 |
| 52 | −297.103672940 | 0.449161173 | L710 | 0.99998200 | 147.956 |
| 53 | 223.869192775 | 28.117900000 | SUPRA1 | 1.50833811 | 122.290 |
| 54 | 548.591751129 | 1.339172987 | L710 | 0.99998200 | 120.081 |
| 55 | 123.937471688 | 34.861300000 | SUPRA1 | 1.50833811 | 99.087 |
| 56 | 211.883788830 | 0.952940583 | L710 | 0.99998200 | 93.568 |
| 57 | 121.391085072 | 21.109500000 | SUPRA1 | 1.50833811 | 82.604 |
| 58 | 178.110541498 | 13.676325222 | L710 | 0.99998200 | 76.860 |
| 59 | 314.102464129 | 10.000000000 | SUPRA1 | 1.50833811 | 71.076 |
| 60 | 60.563892001 | 10.077651049 | L710 | 0.99998200 | 49.477 |
| 61 | 71.706607533 | 10.069000000 | SUPRA1 | 1.50833811 | 47.911 |
| 62 | 53.184242317 | 0.732248727 | L710 | 0.99998200 | 40.780 |
| 63 | 48.728728866 | 24.194000000 | SUPRA1 | 1.50833811 | 39.753 |
| 64 | 325.049018458 | 4.167687088 | L710 | 0.99998200 | 35.772 |
| 65 | 0.000000000 | 5.000000000 | SUPRA1 | 1.50833811 | 32.831 |
| 66 | 0.000000000 | 12.000000000 | L710 | 0.99998200 | 29.694 |
| 67 | 0.000000000 | 0.000000000 |  | 1.00000000 | 13.603 |

TABLE 3 j31o

| Surface | Radii | Thicknesses | Lenses | Refractive index 157.63 nm | 1/2 Free diameter |
|---|---|---|---|---|---|
| 0 | 0.000000000 | 38.482288093 |  | 1.00000000 | 85.333 |
| 1 | 304.292982078 | 22.168809366 | CAF2HL | 1.55840983 | 92.476 |
| 2 | 2741.794481050 | 96.128678854 |  | 1.00000000 | 92.204 |
| 3 | 0.000000000 | 0.000000000 |  | −1.00000000 | 131.930 |
| REFL |  |  |  |  |  |
| 4 | 0.000000000 | −467.095641350 |  | −1.00000000 | 90.070 |
| 5 | 199.893955036 | −10.268444544 | CAF2HL | −1.55840983 | 91.280 |
| 6 | 486.702942680AS | −26.734713685 |  | −1.00000000 | 96.529 |
| 7 | 186.738998389 | −10.064297945 | CAF2HL | −1.55840983 | 99.240 |
| 8 | 447.975139348 | −19.001496621 |  | −1.00000000 | 111.362 |
| 9 | 243.529966034 | 19.001496621 |  | 1.00000000 | 114.369 |
| REFL |  |  |  |  |  |
| 10 | 447.975139348 | 10.064297945 | CAF2HL | 1.55840983 | 112.384 |
| 11 | 186.738998389 | 26.734713685 |  | 1.00000000 | 102.903 |
| 12 | 486.702942680AS | 10.268444544 | CAF2HL | 1.55840983 | 101.523 |
| 13 | 199.893955036 | 464.738613843 |  | 1.00000000 | 96.499 |
| 14 | 0.000000000 | 0.000000000 |  | −1.00000000 | 115.398 |
| REFL |  |  |  |  |  |
| 15 | 0.000000000 | −100.235657635 |  | −1.00000000 | 92.746 |
| 16 | −536.442986965 | −25.379215206 | CAF2HL | −1.55840983 | 94.306 |
| 17 | 629.049380815 | −7.436012624 |  | −1.00000000 | 93.787 |
| 18 | 0.000000000 | −118.304806660 |  | −1.00000000 | 91.342 |
| 19 | −312.177007433AS | −24.720749191 | CAF2HL | −1.55840983 | 94.928 |
| 20 | −734.696609024 | −220.443381712 |  | −1.00000000 | 94.168 |
| 21 | −277.004238298AS | −15.426909916 | CAF2HL | −1.55840983 | 96.206 |
| 22 | −460.130899964 | −73.782961291 |  | −1.00000000 | 95.245 |
| 23 | −158.318468619 | −30.586960517 | CAF2HL | −1.55840983 | 91.460 |
| 24 | −162.867000225 | −41.632945268 |  | −1.00000000 | 84.793 |
| 25 | 419.508310212 | −20.539965049 | CAF2HL | −1.55840983 | 84.016 |
| 26 | −238.581080262 | −31.955227253 |  | −1.00000000 | 85.006 |
| 27 | −430.197019246 | −30.182066783 | CAF2HL | −1.55840983 | 92.237 |
| 28 | 691.939037816AS | −23.703096035 |  | −1.00000000 | 93.527 |
| 29 | −241.462660758AS | −10.000000000 | CAF2HL | −1.55840983 | 97.681 |
| 30 | −182.472613831 | −25.656103361 |  | −1.00000000 | 96.159 |
| 31 | −420.041190250 | −36.705938298 | CAF2HL | −1.55840983 | 98.541 |
| 32 | 324.867666879 | −43.586137768 |  | −1.00000000 | 99.096 |
| 33 | −44866.873107000 | 36.893151865 |  | −1.00000000 | 93.979 |
| 34 | −149.830817441 | −28.311419778 | CAF2HL | −1.55840983 | 94.246 |
| 35 | −315.631878253AS | −18.939811826 |  | −1.00000000 | 91.369 |
| 36 | −172.862510793 | −12.271843841 | CAF2HL | −1.55840983 | 87.996 |
| 37 | −115.635345524 | −27.567353538 |  | −1.00000000 | 81.847 |
| 38 | −229.213645994AS | −32.436472831 | CAF2HL | −1.55840983 | 82.617 |
| 39 | 474.721571790 | −3.611495525 |  | −1.00000000 | 81.971 |
| 40 | −152.435372054 | −30.802088433 | CAF2HL | −1.55840983 | 75.907 |
| 41 | −530.778945822 | −8.465514650 |  | −1.00000000 | 70.966 |
| 42 | −139.504999222 | −41.060952888 | CAF2HL | −1.55840983 | 63.576 |
| 43 | 3040.455878600 | −4.225976128 |  | −1.00000000 | 51.729 |
| 44 | −226.630329417AS | −24.123224774 | CAF2HL | −1.55840983 | 44.179 |
| 45 | 897.778633917 | −8.617797536 |  | −1.00000000 | 33.827 |
| 46 | 0.000000000 | −8.000000000 | CAF2HL | −1.55840983 | 22.352 |
| 47 | 0.000000000 | −2.000000000 | IMMERS | −1.39000000 | 18.217 |
| 48 | 0.000000000 | 0.000000000 |  | −1.00000000 | 17.067 |

Aspherical constants

Surface No. 6

| K | 0.0000 |
|---|---|
| C1 | 3.87858881e−009 |
| C2 | −1.57703627e−013 |
| C3 | 1.62703226e−017 |
| C4 | −1.12332671e−021 |
| C5 | −1.51356191e−026 |
| C6 | 8.57130323e−031 |

Surface No. 12

| K | 0.0000 |
|---|---|
| C1 | 3.87858881e−009 |
| C2 | −1.57703627e−013 |
| C3 | 1.62703226e−017 |
| C4 | −1.12332671e−021 |
| C5 | −1.51356191e−026 |
| C6 | 8.57130323e−031 |

TABLE 3-continued j31o

Surface No. 19

| | |
|---|---|
| K | 0.0000 |
| C1 | 3.62918557e−009 |
| C2 | 6.75596543e−014 |
| C3 | 5.68408321e−019 |
| C4 | −6.78832654e−023 |
| C5 | 6.78338885e−027 |
| C6 | −2.05303753e−031 |

Surface No. 21

| | |
|---|---|
| K | 0.0000 |
| C1 | 1.19759751e−008 |
| C2 | 7.35438590e−014 |
| C3 | 7.03292772e−019 |
| C4 | −1.26321026e−023 |
| C5 | −3.01047364e−027 |
| C6 | 2.08735313e−031 |

Surface No. 28

| | |
|---|---|
| K | 0.0000 |
| C1 | −8.39294529e−009 |
| C2 | −3.39607506e−013 |
| C3 | 8.76320979e−018 |
| C4 | −1.43578199e−021 |
| C5 | 5.59234999e−026 |
| C6 | 2.01810948e−030 |

Surface No. 29

| | |
|---|---|
| K | 0.0000 |
| C1 | 1.74092829e−008 |
| C2 | −1.69607632e−013 |
| C3 | 1.18281063e−017 |
| C4 | −3.08190938e−021 |
| C5 | 1.70082968e−025 |
| C6 | −1.68479126e−030 |

Surface No. 35

| | |
|---|---|
| K | 0.0000 |
| C1 | −2.14453018e−008 |
| C2 | 6.73947641e−013 |
| C3 | −4.84677574e−017 |
| C4 | 5.99264335e−021 |
| C5 | −2.87629386e−025 |
| C6 | 3.90592520e−031 |

Surface No. 38

| | |
|---|---|
| K | 0.0000 |
| C1 | 1.60415031e−008 |
| C2 | 4.78837509e−015 |
| C3 | 2.08320399e−016 |
| C4 | −2.87713700e−020 |
| C5 | 1.77485272e−024 |
| C6 | −1.93501550e−029 |

Surface No. 44

| | |
|---|---|
| K | 0.0000 |
| C1 | −6.56394686e−008 |
| C2 | −8.25210588e−012 |
| C3 | −1.27328625e−016 |
| C4 | −1.16616292e−020 |
| C5 | −1.58133131e−023 |
| C6 | 6.39526832e−027 |

TABLE 4 j32o

| Surface | Radii | Thicknesses | Lenses | Refractive index 157.63 nm | 1/2 Free diameter |
|---|---|---|---|---|---|
| 0 | 0.000000000 | 36.500665837 | | 1.00000000 | 85.333 |
| 1 | 304.292982078 | 22.168809366 | CAF2HL | 1.55840983 | 92.166 |
| 2 | 2741.794481050 | 96.128678854 | | 1.00000000 | 91.891 |

TABLE 4-continued j32o

| | | | | | |
|---|---|---|---|---|---|
| 3 REFL | 0.000000000 | 0.000000000 | | −1.00000000 | 131.415 |
| 4 | 0.000000000 | −467.820384551 | | −1.00000000 | 89.765 |
| 5 | 199.893955036 | −10.268444544 | CAF2HL | −1.55840983 | 91.269 |
| 6 | 486.702942680AS | −26.059978075 | | −1.00000000 | 96.632 |
| 7 | 186.738998389 | −10.064297945 | CAF2HL | −1.55840983 | 99.260 |
| 8 | 447.975139348 | −19.256116633 | | −1.00000000 | 111.485 |
| 9 REFL | 243.529966034 | 19.256116633 | | 1.00000000 | 114.609 |
| 10 | 447.975139348 | 10.064297945 | CAF2HL | 1.55840983 | 112.551 |
| 11 | 186.738998389 | 26.059978075 | | 1.00000000 | 103.039 |
| 12 | 486.702942680AS | 10.268444544 | CAF2HL | 1.55840983 | 101.801 |
| 13 | 199.893955036 | 465.028501331 | | 1.00000000 | 96.752 |
| 14 REFL | 0.000000000 | 0.000000000 | | −1.00000000 | 115.771 |
| 15 | 0.000000000 | −100.235657635 | | −1.00000000 | 93.044 |
| 16 | −536.442986965 | −25.379215206 | CAF2HL | −1.55840983 | 94.574 |
| 17 | 629.049380815 | −8.746601911 | | −1.00000000 | 94.056 |
| 18 | 0.000000000 | −116.715874811 | | −1.00000000 | 91.368 |
| 19 | −312.177007433AS | −24.720749191 | CAF2HL | −1.55840983 | 94.620 |
| 20 | −734.696609024 | −220.365529295 | | −1.00000000 | 93.861 |
| 21 | −277.004238298AS | −15.426909916 | CAF2HL | −1.55840983 | 95.944 |
| 22 | −460.130899964 | −74.636127671 | | −1.00000000 | 94.984 |
| 23 | −158.318468619 | −30.586960517 | CAF2HL | −1.55840983 | 91.216 |
| 24 | −162.867000225 | −41.086604589 | | −1.00000000 | 84.569 |
| 25 | 419.508310212 | −20.539965049 | CAF2HL | −1.55840983 | 83.832 |
| 26 | −238.581080262 | −32.443299462 | | −1.00000000 | 84.836 |
| 27 | −430.197019246 | −30.182066783 | CAF2HL | −1.55840983 | 92.223 |
| 28 | 691.939037816AS | −22.851030925 | | −1.00000000 | 93.515 |
| 29 | −241.462660758AS | −10.000000000 | CAF2HL | −1.55840983 | 97.602 |
| 30 | −182.472613831 | −25.705407401 | | −1.00000000 | 96.085 |
| 31 | −420.041190250 | −36.705938298 | CAF2HL | −1.55840983 | 98.486 |
| 32 | 324.867666879 | −7.220642187 | | −1.00000000 | 99.044 |
| 33 | −149.830817441 | −28.311419778 | CAF2HL | −1.55840983 | 94.165 |
| 34 | −315.631878253AS | −11.206528270 | | −1.00000000 | 91.678 |
| 35 | 0.000000000 | −7.539660426 | | −1.00000000 | 92.142 |
| 36 | −172.862510793 | −12.271843841 | CAF2HL | −1.55840983 | 88.327 |
| 37 | −115.635345524 | −27.665363620 | | −1.00000000 | 82.122 |
| 38 | −229.213645994AS | −32.436472831 | CAF2HL | −1.55840983 | 82.891 |
| 39 | 474.721571790 | −3.783646156 | | −1.00000000 | 82.256 |
| 40 | −152.435372054 | −30.802088433 | CAF2HL | −1.55840983 | 76.122 |
| 41 | −530.778945822 | −8.330902516 | | −1.00000000 | 71.200 |
| 42 | −159.504999222 | −41.060952888 | CAF2HL | −1.55840983 | 63.821 |
| 43 | 3040.455878600 | −4.484154484 | | −1.00000000 | 51.982 |
| 44 | −226.630329417AS | −24.123224774 | CAF2HL | −1.55840983 | 44.183 |
| 45 | 897.778633917 | −0.971829936 | | −1.00000000 | 33.797 |
| 46 | 0.000000000 | −9.700651756 | CAF2HL | −1.55840983 | 31.743 |
| 47 | 0.000000000 | −7.828847134 | | −1.00000000 | 26.288 |
| 48 | 0.000000000 | 0.000446630 | | −1.00000000 | 17.067 |

Aspeherical constants

Surface No. 6

| | |
|---|---|
| K | 0.0000 |
| C1 | 3.87858881e−009 |
| C2 | −1.57703627e−013 |
| C3 | 1.62703226e−017 |
| C4 | −1.12332671e−021 |
| C5 | −1.51356191e−026 |
| C6 | 8.57130323e−031 |

Surface No. 12

| | |
|---|---|
| K | 0.0000 |
| C1 | 3.87858881e−009 |
| C2 | −1.57703627e−013 |
| C3 | 1.62703226e−017 |
| C4 | −1.12332671e−021 |
| C5 | −1.51356191e−026 |
| C6 | 8.57130323e−031 |

Surface No. 19

| | |
|---|---|
| K | 0.0000 |
| C1 | 3.62918557e−009 |
| C2 | 6.75596543e−014 |
| C3 | 5.68408321e−019 |
| C4 | −6.78832654e−023 |

TABLE 4-continued j32o

| | | |
|---|---|---|
| | C5 | 6.78338885e−027 |
| | C6 | −2.05303753e−031 |
| | Surface No. 21 | |
| | K | 0.0000 |
| | C1 | 1.19759751e−008 |
| | C2 | 7.35438590e−014 |
| | C3 | 7.03292772e−019 |
| | C4 | −1.26321026e−023 |
| | C5 | −3.01047364e−027 |
| | C6 | 2.08735313e−031 |
| | Surface No. 28 | |
| | K | 0.0000 |
| | C1 | −8.39294529e−009 |
| | C2 | −3.39607506e−013 |
| | C3 | 8.76320979e−018 |
| | C4 | −1.43578199e−021 |
| | C5 | 5.59234999e−026 |
| | C6 | 2.01810948e−030 |
| | Surface No. 29 | |
| | K | 0.0000 |
| | C1 | 1.74092829e−008 |
| | C2 | −1.69607632e−013 |
| | C3 | 1.18281063e−017 |
| | C4 | −3.08190938e−021 |
| | C5 | 1.70082968e−025 |
| | C6 | −1.68479126e−030 |
| | Surface No. 34 | |
| | K | 0.0000 |
| | C1 | −2.14453018e−008 |
| | C2 | 6.73947641e−013 |
| | C3 | −4.84677574e−017 |
| | C4 | 5.99264335e−021 |
| | C5 | −2.87629386e−025 |
| | C6 | 3.90592520e−031 |
| | Surface No. 38 | |
| | K | 0.0000 |
| | C1 | 1.60415031e−008 |
| | C2 | 4.78837509e−015 |
| | C3 | 2.08320399e−016 |
| | C4 | −2.87713700e−020 |
| | C5 | 1.77485272e−024 |
| | C6 | −1.93501550e−029 |
| | Surface No. 44 | |
| | K | 0.0000 |
| | C1 | −6.56394686e−008 |
| | C2 | −8.25210588e−012 |
| | C3 | −1.27328625e−016 |
| | C4 | −1.16616292e−020 |
| | C5 | −1.58133131e−023 |
| | C6 | 6.39526832e−027 |

TABLE 5 j33o

| Surface | Radii | Thicknesses | Lenses | Refractive index 157.63 nm | 1/2 Free diameter |
|---|---|---|---|---|---|
| 0 | 0.000000000 | 38.054423655 | | 1.00000000 | 85.333 |
| 1 | 304.292982078 | 22.168809366 | CAF2HL | 1.55840983 | 92.441 |
| 2 | 2741.794481050 | 96.128678854 | | 1.00000000 | 92.171 |
| 3 | 0.000000000 | 0.000000000 | | −1.00000000 | 131.865 |
| REFL | | | | | |
| 4 | 0.000000000 | −467.749539716 | | −1.00000000 | 90.082 |
| 5 | 199.893955036 | −10.268444544 | CAF2HL | −1.55840983 | 91.444 |
| 6 | 486.702942680AS | −25.540971142 | | −1.00000000 | 96.627 |
| 7 | 186.738998389 | −10.064297945 | CAF2HL | −1.55840983 | 98.903 |
| 8 | 447.975139348 | −19.398954786 | | −1.00000000 | 110.873 |

TABLE 5-continued j33o

| | | | | | |
|---|---|---|---|---|---|
| 9 REFL | 243.529966034 | 19.398954786 | | 1.00000000 | 114.137 |
| 10 | 447.975139348 | 10.064297945 | CAF2HL | 1.55840983 | 111.985 |
| 11 | 186.738998389 | 25.540971142 | | 1.00000000 | 102.576 |
| 12 | 486.702942680AS | 10.268444544 | CAF2HL | 1.55840983 | 101.403 |
| 13 | 199.893955036 | 465.154328539 | | 1.00000000 | 96.394 |
| 14 REFL | 0.000000000 | 0.000000000 | | −1.00000000 | 115.447 |
| 15 | 0.000000000 | −100.235657635 | | −1.00000000 | 92.750 |
| 16 | −536.442986965 | −25.379215206 | CAF2HL | −1.55840983 | 94.346 |
| 17 | 629.049380815 | −8.324209221 | | −1.00000000 | 93.829 |
| 18 | 0.000000000 | −117.663111488 | | −1.00000000 | 91.238 |
| 19 | −312.177007433AS | −24.720749191 | CAF2HL | −1.55840983 | 94.838 |
| 20 | −734.696609024 | −220.431435837 | | −1.00000000 | 94.085 |
| 21 | −277.004238298AS | −15.426909916 | CAF2HL | −1.55840983 | 96.283 |
| 22 | −460.130899964 | −74.271177440 | | −1.00000000 | 95.326 |
| 23 | −158.318468619 | −30.586960517 | CAF2HL | −1.55840983 | 91.580 |
| 24 | −162.867000225 | −41.410948173 | | −1.00000000 | 84.915 |
| 25 | 419.508310212 | −20.539965049 | CAF2HL | −1.55840983 | 84.171 |
| 26 | −238.581080262 | −32.165915708 | | −1.00000000 | 85.183 |
| 27 | −430.197019246 | −30.182066783 | CAF2HL | −1.55840983 | 92.511 |
| 28 | 691.939037816AS | −23.123455275 | | −1.00000000 | 93.802 |
| 29 | −241.462660758AS | −10.000000000 | CAF2HL | −1.55840983 | 97.962 |
| 30 | −182.472613831 | −25.738903727 | | −1.00000000 | 96.437 |
| 31 | −430.041190250 | −36.705938298 | CAF2HL | −1.55840983 | 98.835 |
| 32 | 324.867666879AS | −7.314163393 | | −1.00000000 | 99.389 |
| 33 | −149.830817441 | −28.311419778 | CAF2HL | −1.55840983 | 94.515 |
| 34 | −315.631878253AS | −15.768661491 | | −1.00000000 | 91.448 |
| 35 | 0.000000000 | −3.044279163 | | −1.00000000 | 91.163 |
| 36 | −172.862510793 | −12.271843841 | CAF2HL | −1.55840983 | 87.933 |
| 37 | −115.635345524 | −27.331297691 | | −1.00000000 | 81.792 |
| 38 | −229.213645994AS | −32.436472831 | CAF2HL | −1.55840983 | 82.538 |
| 39 | 474.721571790 | −4.085179748 | | −1.00000000 | 81.887 |
| 40 | −152.435372054 | −30.802088433 | CAF2HL | −1.55840983 | 75.743 |
| 41 | −530.778945822 | −8.090865960 | | −1.00000000 | 70.786 |
| 42 | −159.504999222 | −41.060952888 | CAF2HL | −1.55840983 | 63.559 |
| 43 | 3040.455878600 | −4.476231798 | | −1.00000000 | 51.715 |
| 44 | −226.630329417AS | −24.123224774 | CAF2HL | −1.55840983 | 44.004 |
| 45 | 897.778633917 | −0.971829936 | | −1.00000000 | 33.650 |
| 46 | 0.000000000 | −9.798128149 | CAF2HL | −1.55840983 | 31.626 |
| 47 | 0.000000000 | 0.000000000 | IMMERS | −1.39000000 | 26.153 |
| 48 | 0.000000000 | −7.818040520 | | −1.00000000 | 26.153 |
| 49 | 0.000000000 | 0.000266950 | | −1.00000000 | 17.067 |

Aspherical constants

Surface No. 6

| | |
|---|---|
| K | 0.0000 |
| C1 | 3.87858881e−009 |
| C2 | −1.57703627e−013 |
| C3 | 1.62703226e−017 |
| C4 | −1.12332671e−021 |
| C5 | −1.51356191e−026 |
| C6 | 8.57130323e−031 |

Surface No. 12

| | |
|---|---|
| K | 0.0000 |
| C1 | 3.87858881e−009 |
| C2 | −1.57703627e−013 |
| C3 | 1.62703226e−017 |
| C4 | −1.12332671e−021 |
| C5 | −1.51356191e−026 |
| C6 | 8.57130323e−031 |

Surface No. 19

| | |
|---|---|
| K | 0.0000 |
| C1 | 3.62918557e−009 |
| C2 | 6.75596543e−014 |
| C3 | 5.68408321e−019 |
| C4 | −6.78832654e−023 |
| C5 | 6.78338885e−027 |
| C6 | −2.05303753e−031 |

Surface No. 21

| | |
|---|---|
| K | 0.0000 |
| C1 | 1.19759751e−008 |

TABLE 5-continued j33o

| | | |
|---|---|---|
| | C2 | 7.35438590e-014 |
| | C3 | 7.03292772e-019 |
| | C4 | -1.26321026e-023 |
| | C5 | -3.01047364e-027 |
| | C6 | 2.08735313e-031 |
| | Surface No. 28 | |
| | K | 0.0000 |
| | C1 | -8.39294529e-009 |
| | C2 | -3.39607506e-013 |
| | C3 | 8.76320979e-018 |
| | C4 | -1.43578199e-021 |
| | C5 | 5.59234999e-026 |
| | C6 | 2.01810948e-030 |
| | Surface No. 29 | |
| | K | 0.0000 |
| | C1 | 1.74092829e-008 |
| | C2 | -1.69607632e-013 |
| | C3 | 1.18281063e-017 |
| | C4 | -3.08190938e-021 |
| | C5 | 1.70082968e-025 |
| | C6 | -1.68479126e-030 |
| | Surface No. 32 | |
| | K | 0.0000 |
| | C1 | -3.60582630e-011 |
| | C2 | 2.95599027e-015 |
| | C3 | -7.37891981e-019 |
| | C4 | 6.32721261e-023 |
| | C5 | -3.13935388e-027 |
| | C6 | 0.00000000e+000 |
| | Surface No. 34 | |
| | K | 0.0000 |
| | C1 | -2.14453018e-008 |
| | C2 | 6.73947641e-013 |
| | C3 | -4.84677574e-017 |
| | C4 | 5.99264335e-021 |
| | C5 | -2.87629386e-025 |
| | C6 | 3.90592520e-031 |
| | Surface No. 38 | |
| | K | 0.0000 |
| | C1 | 1.60415031e-008 |
| | C2 | 4.78837509e-015 |
| | C3 | 2.08320399e-016 |
| | C4 | -2.87713700e-020 |
| | C5 | 1.77485272e-024 |
| | C6 | -1.93501550e-029 |
| | Surface No. 44 | |
| | K | 0.0000 |
| | C1 | -6.56394686e-008 |
| | C2 | -8.25210588e-012 |
| | C3 | -1.27328625e-016 |
| | C4 | -1.16616292e-020 |
| | C5 | -1.58133131e-023 |
| | C6 | 6.39526832e-027 |

TABLE 6 j34o

| Surface | Radii | Thicknesses | Lenses | Refractive index 157.63 nm | 1/2 Free diameter |
|---|---|---|---|---|---|
| 0 | 0.000000000 | 36.161351461 | | 1.00000000 | 74.999 |
| 1 | 304.292982078 | 22.168809366 | CAF2HL | 1.55840983 | 80.904 |
| 2 | 2741.794481050 | 96.128678854 | | 1.00000000 | 80.670 |
| 3 | 0.000000000 | 0.000000000 | | -1.00000000 | 112.393 |
| REFL | | | | | |
| 4 | 0.000000000 | -467.829196611 | | -1.00000000 | 80.034 |
| 5 | 199.893955036 | -10.268444544 | CAF2HL | -1.55840983 | 91.463 |

TABLE 6-continued j34o

| Surface | Radii | Thicknesses | Lenses | Refractive index 157.63 nm | 1/2 Free diameter |
|---|---|---|---|---|---|
| 6 | 486.702942680AS | −26.489029779 |  | −1.00000000 | 96.705 |
| 7 | 186.738998389 | −10.064297945 | CAF2HL | −1.55840983 | 99.256 |
| 8 | 447.975139348 | −19.104022207 |  | −1.00000000 | 111.038 |
| 9 | 243.529966034 | 19.104022207 |  | 1.00000000 | 114.040 |
| REFL |  |  |  |  |  |
| 10 | 447.975139348 | 10.064297945 | CAF2HL | 1.55840983 | 111.894 |
| 11 | 186.738998389 | 26.489029779 |  | 1.00000000 | 102.220 |
| 12 | 486.702942680AS | 10.268444544 | CAF2HL | 1.55840983 | 100.696 |
| 13 | 199.893955036 | 464.947124417 |  | 1.00000000 | 95.456 |
| 14 | 0.000000000 | 0.000000000 |  | −1.00000000 | 100.079 |
| REFL |  |  |  |  |  |
| 15 | 0.000000000 | −100.235657635 |  | −1.00000000 | 82.389 |
| 16 | −536.442986965 | −25.379215206 | CAF2HL | −1.55840983 | 82.451 |
| 17 | 629.049380815 | −8.793894052 |  | −1.00000000 | 81.752 |
| 18 | 0.000000000 | −116.568104874 |  | −1.00000000 | 79.557 |
| 19 | −312.177007433AS | −24.720749191 | CAF2HL | −1.55840983 | 83.889 |
| 20 | −734.696609024 | −220.322326822 |  | −1.00000000 | 83.299 |
| 21 | −277.004238298AS | −15.426909916 | CAF2HL | −1.55840983 | 89.258 |
| 22 | −460.130899964 | −74.392166007 |  | −1.00000000 | 88.409 |
| 23 | −158.318468619 | −30.586960517 | CAF2HL | −1.55840983 | 86.736 |
| 24 | −162.867000225 | −41.203375310 |  | −1.00000000 | 80.658 |
| 25 | 419.508310212 | −20.539965049 | CAF2HL | −1.55840983 | 79.998 |
| 26 | −238.581080262 | −32.439510521 |  | −1.00000000 | 81.566 |
| 27 | −430.197019246 | −30.182066783 | CAF2HL | −1.55840983 | 89.557 |
| 28 | 691.939037816AS | −22.871775763 |  | −1.00000000 | 91.095 |
| 29 | −241.462660758AS | −10.000000000 | CAF2HL | −1.55840983 | 95.940 |
| 30 | −182.472613831 | −25.719445559 |  | −1.00000000 | 94.675 |
| 31 | −420.041190250 | −36.705938298 | CAF2HL | −1.55840983 | 97.416 |
| 32 | 324.867666879 | −7.158117532 |  | −1.00000000 | 98.118 |
| 33 | −149.830817441 | −28.311419778 | CAF2HL | −1.55840983 | 94.383 |
| 34 | −315.631878253AS | −15.246525268 |  | −1.00000000 | 91.407 |
| 35 | 0.000000000 | −3.460262414 |  | −1.00000000 | 91.263 |
| 36 | −172.862510793 | −12.271843841 | CAF2HL | −1.55840983 | 87.558 |
| 37 | −115.635345524 | −27.669597804 |  | −1.00000000 | 81.275 |
| 38 | −229.213645994AS | −32.436472831 | CAF2HL | −1.55840983 | 81.851 |
| 39 | 474.721571790 | −3.859943832 |  | −1.00000000 | 81.002 |
| 40 | −152.435372054 | −30.802088433 | CAF2HL | −1.55840983 | 74.327 |
| 41 | −530.778945822 | −8.295933466 |  | −1.00000000 | 68.995 |
| 42 | −159.504999222 | −41.060952888 | CAF2HL | −1.55840983 | 61.568 |
| 43 | 3040.455878600 | −4.464476855 |  | −1.00000000 | 49.097 |
| 44 | −226.630329417AS | −24.123224774 | CAF2HL | −1.55840983 | 41.663 |
| 45 | 897.778633917 | −0.971829936 |  | −1.00000000 | 30.986 |
| 46 | 0.000000000 | −9.748905783 | CAF2HL | −1.55840983 | 29.101 |
| 47 | 0.000000000 | 0.000000000 | IMMERS | −1.39000000 | 23.730 |
| 48 | 0.000000000 | −7.827028317 |  | −1.00000000 | 23.730 |
| 49 | 0.000000000 | 0.000419580 |  | −1.00000000 | 15.000 |

What is claimed is:

1. Projection objective for projecting a pattern arranged in an object plane of the projection objective into an image plane of the projection objective, having a multiplicity of optical elements which are arranged along an optical axis of the projection objective, wherein:
   the optical elements comprise a first group of optical elements following the object plane, and a last optical element following the first group, arranged next to the image plane and defining an exit surface of the projection objective which is arranged at a working distance from the image plane;
   the last optical element is substantially without refracting power and has at most slight curvature; and
   the projection objective is adapted with reference to aberrations to the effect that the working distance is filled up with an immersion medium with a refractive index substantially greater than 1;
   wherein a sum of the free distance in front of the last optical element and the distance between the exit surface and image plane is greater than approximately 0.5% of the overall length of the projection objective.

2. Projection objective according to claim 1, wherein a distance that permits a substantial axial displacement of the last optical element, exists between the first group and the last optical element.

3. Projection objective according to claim 1, wherein a free spacing in front of the last element is more than approximately 0.5% of the overall length of the projection objective.

4. Projection objective according to claim 1, wherein the last optical element comprises at least one substantially plane-parallel plate made from transparent material.

5. Projection objective according to claim 1, adapted to be adjustable largely or completely between an immersion configuration and a dry configuration with the aid of a variation in the thickness of the last optical element.

6. Projection objective according to claim 5, adapted to be adjustable in conjunction with a displacement of the last optical element relative to the image plane.

7. Projection objective according to claim 1, to which there is assigned at least one exchangeable optical correction element.

8. Projection objective according to claim 1, wherein the last optical element comprises two mutually separable, substantially plane-parallel plates made from transparent material.

9. Projection objective according to claim 1, wherein the last optical element is exchangeable.

10. Projection objective according to claim 1, wherein the optical elements of the first group include at least one displaceable optical element.

11. Projection objective according to claim 10, wherein a free distance adjacent to the displaceable element is dimensioned so large that it is possible by displacing the at least one displaceable optical element to correct at least a fraction of aberrations which are produced by adaptation of the last optical element to an immersion medium.

12. Projection objective according to claim 1, which has an image-side numerical aperture (NA) NA<1 in the case of use of an immersion medium between the exit surface and image plane.

13. Projection objective for projecting a pattern arranged in an object plane of the projection objective into an image plane of the projection objective, having a multiplicity of optical elements which are arranged along an optical axis of the projection objective, wherein:
the optical elements comprise a first group of optical elements following the object plane, and a last optical element following the first group, arranged next to the image plane and defining an exit surface of the projection objective which is arranged at a working distance from the image plane;
the last optical element is substantially without refracting power and has at most only slight curvature; and
the projection objective is adapted with reference to aberrations to the effect that the working distance is filled up with a gas with a refractive index close to 1;
wherein the projection objective is adapted to be adjustable largely or completely between an immersion configuration and a dry configuration with the aid of a variation in the thickness of the last optical element.

14. Projection objective according to claim 13, adapted to be adjustable in conjunction with a displacement of the last optical element relative to the image plane.

15. Projection objective according claim 13, wherein a sum of the free distance in front of the last optical element and the distance between the exit surface and image plane is greater than approximately 0.5% of the overall length of the projection objective.

16. Projection objective according to claim 13, wherein a free spacing in front of the last element is more than approximately 0.5% of the overall length of the projection objective.

17. Projection objective according to claim 13, wherein the last optical element is exchangeable.

18. Projection objective according to claim 13, wherein the last optical element has a variable thickness.

19. Projection objective according to claim 13, wherein the last optical element comprises at least one substantially plane-parallel plate made from transparent material.

20. Projection objective according to claim 13, wherein the last optical element comprises two mutually separable, substantially plane-parallel plates made from transparent material.

21. Projection objective according to claim 13, wherein the optical elements of the first group include at least one displaceable optical element.

22. Projection objective according to claim 21, wherein a free distance adjacent to the displaceable element is dimensioned so large that it is possible by displacing the at least one displaceable optical element to correct at least a fraction of aberrations which are produced by adaptation of the last optical element to an immersion medium.

23. Projection objective according to claim 13, to which there is assigned at least one exchangeable optical correction element.

24. Projection objective according to claim 13, which has an image-side numerical aperture (NA) NA<1 in the case of use of an immersion medium between the exit surface and image plane.

25. Projection objective for projecting a pattern arranged in an object plane of the projection objective into an image plane of the projection objective, having a multiplicity of optical elements which are arranged along an optical axis of the projection objective, wherein:
the optical elements comprise a first group of optical elements following the object plane, and a last optical element following the first group, arranged next to the image plane and defining an exit surface of the projection objective which is arranged at a working distance from the image plane;
the last optical element is substantially without refracting power and has at most only slight curvature; and
the projection objective is adapted with reference to aberrations to the effect that the working distance is filled up with a gas with a refractive index close to 1;
wherein the last optical element is exchangeable.

26. Projection objective according to claim 25, wherein the last optical element has a variable thickness.

27. Projection objective according to claim 26, wherein the last optical element has a thickness which is variable without removal of material or application of material.

28. Projection objective according to claim 26, wherein the last optical element comprises a plurality of mutually disconnectable components which are one of arranged at a distance from one another and interconnected in an optically neutral fashion.

29. Projection objective according to claim 28, wherein components of the last optical element are made of different optical materials.

30. Projection objective according to claim 29, wherein at least one component is made of fluoride crystal.

31. Projection objective according to claim 25, wherein the last optical element comprises at least one substantially plane-parallel plate made from transparent material.

32. Projection objective according to claim 25, wherein the last optical element comprises two mutually separable, substantially plane-parallel plates made from transparent material.

33. Projection objective according claim 25, wherein a sum of the free distance in front of the last optical element and the distance between the exit surface and image plane is greater than approximately 0.5% of the overall length of the projection objective.

34. Projection objective according to claim 25, wherein a free spacing in front of the last element is more than approximately 0.5% of the overall length of the projection objective.

35. Projection objective according to claim 25, adapted to be adjustable largely or completely between an immersion configuration and a dry configuration with the aid of a variation in the thickness of the last optical element.

36. Projection objective according to claim 35, adapted to be adjustable in conjunction with a displacement of the last optical element relative to the image plane.

37. Projection objective according to claim 25, wherein the optical elements of the first group include at least one displaceable optical element.

38. Projection objective according to claim 37, wherein a free distance adjacent to the displaceable element is dimensioned so large that it is possible by displacing the at least one displaceable optical element to correct at least a fraction of aberrations which are produced by adaptation of the last optical element to an immersion medium.

39. Projection objective according to claim 25, to which there is assigned at least one exchangeable optical correction element.

40. Projection objective according to claim 25, which has an image-side numerical aperture (NA) NA<1 in the case of use of an immersion medium between the exit surface and image plane.

41. Projection objective for projecting a pattern arranged in an object plane of the projection objective into an image plane of the projection objective, having a multiplicity of optical elements which are arranged along an optical axis of the projection objective, wherein:
  the optical elements comprise a first group of optical elements following the object plane, and a last optical element following the first group, arranged next to the image plane and defining an exit surface of the projection objective which is arranged at a working distance from the image plane;
  the last optical element is substantially without refracting power and has at most slight curvature; and
  the projection objective is adapted with reference to aberrations to the effect that the working distance is filled up with an immersion medium with a refractive index substantially greater than 1;
  wherein the projection objective is adapted to be adjustable largely or completely between an immersion configuration and a dry configuration with the aid of a variation in the thickness of the last optical element.

42. Projection objective according to claim 41, adapted to be adjustable in conjunction with a displacement of the last optical element relative to the image plane.

43. Projection objective according to claim 41, wherein a free spacing in front of the last element is more than approximately 0.5% of the overall length of the projection objective.

44. Projection objective according to claim 41, wherein the last optical element is exchangeable.

45. Projection objective according to claim 41, wherein the last optical element has a variable thickness.

46. Projection objective according to claim 41, wherein the last optical element comprises at least one substantially plane-parallel plate made from transparent material.

47. Projection objective according to claim 41, wherein the last optical element comprises two mutually separable, substantially plane-parallel plates made from transparent material.

48. Projection objective according to claim 41, wherein the optical elements of the first group include at least one displaceable optical element.

49. Projection objective according to claim 48, wherein a free distance adjacent to the displaceable element is dimensioned so large that it is possible by displacing the at least one displaceable optical element to correct at least a fraction of aberrations which are produced by adaptation of the last optical element to an immersion medium.

50. Projection objective according to claim 41, to which there is assigned at least one exchangeable optical correction element.

51. Projection objective according to claim 41, which has an image-side numerical aperture (NA) NA<1 in the case of use of an immersion medium between the exit surface and image plane.

52. Projection objective for projecting a pattern arranged in an object plane of the projection objective into an image plane of the projection objective, having a multiplicity of optical elements which are arranged along an optical axis of the projection objective, wherein:
  the optical elements comprise a first group of optical elements following the object plane, and a last optical element following the first group, arranged next to the image plane and defining an exit surface of the projection objective which is arranged at a working distance from the image plane;
  the last optical element is substantially without refracting power and has at most slight curvature; and
  the projection objective is adapted with reference to aberrations to the effect that the working distance is filled up with an immersion medium with a refractive index substantially greater than 1;
  wherein the last optical element is exchangeable.

53. Projection objective according to claim 52, wherein the last optical element has a variable thickness.

54. Projection objective according to claim 53, wherein the last optical element has a thickness which is variable without removal of material or application of material.

55. Projection objective according to claim 53, wherein the last optical element comprises a plurality of mutually disconnectable components which are one of arranged at a distance from one another and interconnected in an optically neutral fashion.

56. Projection objective according to claim 55, wherein components of the last optical element are made of different optical materials.

57. Projection objective according to claim 56, wherein at least one component is made of fluoride crystal.

58. Projection objective according to claim 52, wherein the last optical element comprises at least one substantially plane-parallel plate made from transparent material.

59. Projection objective according to claim 52, wherein the last optical element comprises two mutually separable, substantially plane-parallel plates made from transparent material.

60. Projection objective according to claim 52, wherein a free spacing in front of the last element is more than approximately 0.5% of the overall length of the projection objective.

61. Projection objective according to claim 52, adapted to be adjustable largely or completely between an immersion configuration and a dry configuration with the aid of a variation in the thickness of the last optical element; and
  adapted to be adjustable in conjunction with a displacement of the last optical element relative to the image plane.

62. Projection objective according to claim 52, wherein the optical elements of the first group include at least one displaceable optical element.

63. Projection objective according to claim 62, wherein a free distance adjacent to the displaceable element is dimensioned so large that it is possible by displacing the at least one displaceable optical element to correct at least a fraction of aberrations which are produced by adaptation of the last optical element to an immersion medium.

64. Projection objective according to claim 52, to which there is assigned at least one exchangeable optical correction element.

65. Projection objective according to claim 52, which has an image-side numerical aperture (NA) NA<1 in the case of use of an immersion medium between the exit surface and image plane.

66. Projection objective for projecting a pattern arranged in an object plane of the projection objective into an image plane of the projection objective, having a multiplicity of optical elements which are arranged along an optical axis of the projection objective, wherein:
the optical elements comprise a first group of optical elements following the object plane, and a last optical element following the first group, arranged next to the image plane and defining an exit surface of the projection objective which is arranged at a working distance from the image plane;
the last optical element is substantially without refracting power and has at most slight curvature; and
the projection objective is adapted with reference to aberrations to the effect that the working distance is filled up with an immersion medium with a refractive index substantially greater than 1;
wherein the last optical element comprises two mutually separable, substantially plane-parallel plates made from transparent material.

67. Projection objective according to claim 66, wherein the last optical element has a planar exit surface.

68. Projection objective according to claim 66, wherein the optical material, bordering the exit surface, of the last optical element has a refractive index $n_E$ which is in the vicinity of the refractive index $n_I$ of the immersion medium.

69. Projection objective according to claim 68, wherein a ratio $n_I/n_E$ is at least more than 0.8.

70. Projection objective according to claim 66, adapted to be adjustable largely or completely between an immersion configuration and a dry configuration with the aid of a variation in the thickness of the last optical element;
adapted to be adjustable in conjunction with a displacement of the last optical element relative to the image plane.

71. Projection objective according to claim 66, wherein the last optical element has a variable thickness.

72. Projection objective according to claim 71, wherein the last optical element comprises a plurality of mutually disconnectable components which are one of arranged at a distance from one another and interconnected in an optically neutral fashion.

73. Projection objective according to claim 72, wherein components of the last optical element are made of different optical materials.

74. Projection objective according to claim 73, wherein at least one component is made of fluoride crystal.

75. Projection objective according to claim 66, wherein the last optical element comprises at least one substantially plane-parallel plate made from transparent material.

76. Projection objective according to claim 66, wherein the optical elements of the first group include at least one displaceable optical element.

77. Projection objective according to claim 76, wherein a free distance adjacent to the displaceable element is dimensioned so large that it is possible by displacing the at least one displaceable optical element to correct at least a fraction of aberrations which are produced by adaptation of the last optical element to an immersion medium.

78. Projection objective according to claim 66, which has an image-side numerical aperture (NA) NA<1 in the case of use of an immersion medium between the exit surface and image plane.

79. Projection objective for projecting a pattern arranged in an object plane of the projection objective into an image plane of the projection objective, having a multiplicity of optical elements which are arranged along an optical axis of the projection objective, wherein:
the optical elements comprise a first group of optical elements following the object plane, and a last optical element following the first group, arranged next to the image plane and defining an exit surface of the projection objective which is arranged at a working distance from the image plane;
the last optical element is substantially without refracting power and has at most slight curvature; and
the projection objective is adapted with reference to aberrations to the effect that the working distance is filled up with an immersion medium with a refractive index substantially greater than 1;
wherein the optical elements of the first group include at least one displaceable optical element; and
wherein a free distance adjacent to the displaceable element is dimensioned so large that it is possible by displacing the at least one displaceable optical element to correct at least a fraction of aberrations which are produced by adaptation of the last optical element to an immersion medium.

80. Projection objective according to claim 79, to which there is assigned at least one exchangeable optical correction element.

81. Projection objective according claim 80, wherein at least one of the displaceable optical elements is movable along the optical axis.

82. Projection objective according to claim 79, wherein a free spacing in front of the last element is more than approximately 0.5% of the overall length of the projection objective.

83. Projection objective according to claim 79, adapted to be adjustable largely or completely between an immersion configuration and a dry configuration with the aid of a variation in the thickness of the last optical element;
adapted to be adjustable in conjunction with a displacement of the last optical element relative to the image plane.

84. Projection objective according to claim 79, wherein the last optical element comprises at least one substantially plane-parallel plate made from transparent material.

85. Projection objective according to claim 79, wherein the last optical element comprises two mutually separable, substantially plane-parallel plates made from transparent material.

86. Projection objective according to claim 79, which has an image-side numerical aperture (NA) NA<1 in the case of use of an immersion medium between the exit surface and image plane.

87. Projection objective for projecting a pattern in an object plane of the projection objective into an image plane of the projection objective comprising:
a multiplicity of optical elements which are arranged along an optical axis of the projection objective;
wherein the optical elements comprise:
a first group of optical elements following the object plane; and a last optical element following the first group, arranged next to the image plane and defining an exit surface of the projection objective, which is arranged at a working distance from the image plane;

wherein the last optical element is substantially without refracting power and has, at most, slight curvature;

wherein the projection objective is adapted to be adjustable largely or completely between an immersion configuration and a dry configuration with the aid of a variation in a thickness of the last optical element;

wherein, in the immersion configuration, the projection objective is adapted with reference to aberrations to the effect that the working distance is filled up with an immersion medium with a refractive index substantially greater than 1;

wherein, in the dry configuration, the projection objective is adapted with reference to aberrations to the effect that the working distance is filled up with a gas with a refractive index at least close to 1; and wherein a sum of the free distance in front of the last optical element and the distance between the exit surface and image plane is greater than approximately 0.5% of the overall length of the projection objective.

88. Projection objective for projecting a pattern in an object plane of the projection objective into an image plane of the projection objective comprising:

a multiplicity of optical elements which are arranged along an optical axis of the projection objective;

wherein the optical elements comprise:

a first group of optical elements following the object plane; and a last optical element following the first group, arranged next to the image plane and defining an exit surface of the projection objective, which is arranged at a working distance from the image plane;

wherein the last optical element is substantially without refracting power and has, at most, slight curvature;

wherein the projection objective is adapted to be adjustable largely or completely between an immersion configuration and a dry configuration with the aid of a variation in a thickness of the last optical element;

wherein, in the immersion configuration, the projection objective is adapted with reference to aberrations to the effect that the working distance is filled up with an immersion medium with a refractive index substantially greater than 1;

wherein, in the dry configuration, the projection objective is adapted with reference to aberrations to the effect that the working distance is filled up with a gas with a refractive index at least close to 1; and wherein a free spacing in front of the last element is more than approximately 0.5% of the overall length of the projection objective.

89. Projection objective for projecting a pattern in an object plane of the projection objective into an image plane of the projection objective comprising:

a multiplicity of optical elements which are arranged along an optical axis of the projection objective;

wherein the optical elements comprise:

a first group of optical elements following the object plane; and a last optical element following the first group, arranged next to the image plane and defining an exit surface of the projection objective, which is arranged at a working distance from the image plane;

wherein the last optical element is substantially without refracting power and has, at most, slight curvature;

wherein the projection objective is adapted to be adjustable largely or completely between an immersion configuration and a dry configuration with the aid of a variation in a thickness of the last optical element;

wherein, in the immersion configuration the projection objective is adapted with reference to aberrations to the effect that the working distance is filled up with an immersion medium with a refractive index substantially greater than 1;

wherein, in the dry configuration, the projection objective is adapted with reference to aberrations to the effect that the working distance is filled up with a gas with a refractive index at least close to 1; and wherein the last optical element is exchangeable.

90. Projection objective according to claim 89, wherein at least one optical element of the first group has at least one optical surface with a reversibly or permanently variable surface curvature.

91. Projection objective for projecting a pattern in an object plane of the projection objective into an image plane of the projection objective comprising:

a multiplicity of optical elements which are arranged along an optical axis of the projection objective;

wherein the optical elements comprise:

a first group of optical elements following the object plane; and a last optical element following the first group, arranged next to the image plane and defining an exit surface of the projection objective, which is arranged at a working distance from the image plane;

wherein the last optical element is substantially without refracting power and has, at most, slight curvature;

wherein the projection objective is adapted to be adjustable largely or completely between an immersion configuration and a dry configuration with the aid of a variation in a thickness of the last optical element;

wherein, in the immersion configuration, the projection objective is adapted with reference to aberrations to the effect that the working distance is filled up with an immersion medium with a refractive index substantially greater than 1;

wherein, in the dry configuration the projection objective is adapted with reference to aberrations to the effect that the working distance is filled up with a gas with a refractive index at least close to 1; and wherein the last optical element has a variable thickness.

92. Projection objective according to claim 91, wherein the last optical element has a thickness which is variable without removal of material or application of material.

93. Projection objective according to claim 91, wherein the last optical element comprises a plurality of mutually disconnectable components which are one of arranged at a distance from one another and interconnected in an optically neutral fashion.

94. Projection objective according to claim 93, wherein components of the last optical element are made of different optical materials.

95. Projection objective according to claim 94, wherein at least one component is made of fluoride crystal.

96. Projection objective for projecting a pattern in an object plane of the projection objective into an image plane of the projection objective comprising:

a multiplicity of optical elements which are arranged along an optical axis of the projection objective;

wherein the optical elements comprise:

a first group of optical elements following the object plane; and a last optical element following the first group, arranged next to the image plane and defining an exit surface of the projection objective, which is arranged at a working distance from the image plane;

wherein the last optical element is substantially without refracting power and has, at most, slight curvature;

wherein the projection objective is adapted to be adjustable largely or completely between an immersion configuration and a dry configuration with the aid of a variation in a thickness of the last optical element;

wherein, in the immersion configuration, the projection objective is adapted with reference to aberrations to the effect that the working distance is filled up with an immersion medium with a refractive index substantially greater than 1;

wherein, in the dry configuration, the projection objective is adapted with reference to aberrations to the effect that the working distance is filled up with a gas with a refractive index at least close to 1; and wherein the last optical element comprises two mutually separable, substantially plane-parallel plates made from transparent material.

97. Projection objective for projecting a pattern in an object plane of the projection objective into an image plane of the projection objective comprising:

a multiplicity of optical elements which are arranged along an optical axis of the projection objective;

wherein the optical elements comprise:

a first group of optical elements following the object plane; and a last optical element following the first group, arranged next to the image plane and defining an exit surface of the projection objective, which is arranged at a working distance from the image plane;

wherein the last optical element is substantially without refracting power and has, at most, slight curvature;

wherein the projection objective is adapted to be adjustable largely or completely between an immersion configuration and a dry configuration with the aid of a variation in a thickness of the last optical element;

wherein, in the immersion configuration, the projection objective is adapted with reference to aberrations to the effect that the working distance is filled up with an immersion medium with a refractive index substantially greater than 1;

wherein, in the dry configuration, the projection objective is adapted with reference to aberrations to the effect that the working distance is filled up with a gas with a refractive index at least close to 1;

wherein the optical elements of the first group include at least one displaceable optical element; and wherein a free distance adjacent to the displaceable element is dimensioned so large that it is possible by displacing the at least one displaceable optical element to correct at least a fraction of aberrations which are produced by adaptation of the last optical element to an immersion medium.

98. Projection objective for projecting a pattern in an object plane of the projection objective into an image plane of the projection objective comprising:

a multiplicity of optical elements which are arranged along an optical axis of the projection objective;

wherein the optical elements comprise:

a first group of optical elements following the object plane; and a last optical element following the first group, arranged next to the image plane and defining an exit surface of the projection objective, which is arranged at a working distance from the image plane;

wherein the last optical element is substantially without refracting power and has, at most, slight curvature;

wherein the projection objective is adapted to be adjustable largely or completely between an immersion configuration and a dry configuration with the aid of a variation in a thickness of the last optical element;

wherein, in the immersion configuration, the projection objective is adapted with reference to aberrations to the effect that the working distance is filled up with an immersion medium with a refractive index substantially greater than 1;

wherein, in the dry configuration, the projection objective is adapted with reference to aberrations to the effect that the working distance is filled up with a gas with a refractive index at least close to 1; and to which there is assigned at least one exchangeable optical correction element.

99. Projection objective for projecting a pattern in an object plane of the projection objective into an image plane of the projection objective comprising:

a multiplicity of optical elements which are arranged along an optical axis of the projection objective;

wherein the optical elements comprise:

a first group of optical elements following the object plane; and a last optical element following the first group, arranged next to the image plane and defining an exit surface of the projection objective, which is arranged at a working distance from the image plane;

wherein the last optical element is substantially without refracting power and has, at most, slight curvature;

wherein the projection objective is adapted to be adjustable largely or completely between an immersion configuration and a dry configuration with the aid of a variation in a thickness of the last optical element;

wherein, in the immersion configuration, the projection objective is adapted with reference to aberrations to the effect that the working distance is filled up with an immersion medium with a refractive index substantially greater than 1;

wherein, in the dry configuration, the projection objective is adapted with reference to aberrations to the effect that the working distance is filled up with a gas with a refractive index at least close to 1; and which has an image-side numerical aperture (NA) NA<1 in the case of use of an immersion medium between the exit surface and image plane.

* * * * *